United States Patent
Shibuya

(10) Patent No.: US 10,294,108 B2
(45) Date of Patent: May 21, 2019

(54) METHOD OF PRODUCING CARBON NANOSTRUCTURES, AND CARBON NANOTUBES

(71) Applicant: ZEON CORPORATION, Chiyoda-ku, Tokyo (JP)

(72) Inventor: Akiyoshi Shibuya, Tokyo (JP)

(73) Assignee: ZEON CORPORATION, Chiyoda-ku, Tokyo (JP)

(*) Notice: Subject to any disclaimer, the term of this patent is extended or adjusted under 35 U.S.C. 154(b) by 0 days.

(21) Appl. No.: 15/992,586

(22) Filed: May 30, 2018

(65) Prior Publication Data
US 2018/0273385 A1 Sep. 27, 2018

Related U.S. Application Data

(62) Division of application No. 15/021,743, filed as application No. PCT/JP2014/005009 on Sep. 30, 2014, now Pat. No. 10,011,489.

(30) Foreign Application Priority Data

Sep. 30, 2013 (JP) .................. 2013-205931
Sep. 30, 2013 (JP) .................. 2013-205933
Sep. 30, 2013 (JP) .................. 2013-205934

(51) Int. Cl.
*C01B 32/15* (2017.01)
*C23C 16/455* (2006.01)
(Continued)

(52) U.S. Cl.
CPC .............. *C01B 32/15* (2017.08); *C01B 32/16* (2017.08); *C23C 16/455* (2013.01); *B82Y 30/00* (2013.01);
(Continued)

(58) Field of Classification Search
CPC ............ C01B 31/0226; C01B 2202/32; C01B 2202/36; C01B 31/0206; C01B 31/022;
(Continued)

(56) References Cited

U.S. PATENT DOCUMENTS

| | | |
|---|---|---|
| 5,618,875 A | 4/1997 | Baker et al. |
| 2003/0012721 A1 | 1/2003 | Nakayama et al. |

(Continued)

FOREIGN PATENT DOCUMENTS

| | | |
|---|---|---|
| CN | 101423209 A | 5/2009 |
| EP | 1440932 A2 | 7/2004 |

(Continued)

OTHER PUBLICATIONS

Apr. 5, 2016, International Preliminary Report on Patentability issued in the International Patent Application No. PCT/JP2014/005009.

(Continued)

*Primary Examiner* — Daniel McCracken
(74) *Attorney, Agent, or Firm* — Kenja IP Law PC

(57) ABSTRACT

A method of producing a carbon nanostructure is provided that enables production of a high-quality carbon nanostructure with a high yield. The method of producing a carbon nanostructure includes supplying a feedstock gas to a catalyst and growing a carbon nanostructure by chemical vapor deposition. A gas X that is derived from the feedstock gas and that comes into contact with the catalyst contains a hydrocarbon A having at least one cyclopentadiene skeleton and a hydrocarbon B having at least one acetylene skeleton. A total volume concentration [A] of the hydrocarbon A is at least 0.06%.

4 Claims, 14 Drawing Sheets

(51) Int. Cl.
*C01B 32/16* (2017.01)
*B82Y 40/00* (2011.01)
*B82Y 30/00* (2011.01)

(52) U.S. Cl.
CPC ........... *B82Y 40/00* (2013.01); *C01B 2202/32* (2013.01); *C01B 2202/36* (2013.01); *Y10S 977/742* (2013.01); *Y10S 977/843* (2013.01)

(58) Field of Classification Search
CPC .............. C01B 31/0233; C01B 31/024; C01B 31/0246; C01B 31/0253; C01B 31/026; C01B 31/0273; C01B 31/028; C01B 31/0286; C01B 31/0293; C01B 2202/00; C01B 2208/02; C01B 2202/04; C01B 2202/06; C01B 2202/08; C01B 2202/10; C01B 2202/20; C01B 2202/22; C01B 2202/24; C01B 2202/26; C01B 2202/28; C01B 2202/30; C01B 2202/34; C23C 16/455; B82Y 40/00; B82Y 30/00; B82Y 5/00; B82Y 10/00; B82Y 15/00; B82Y 20/00; B82Y 25/00; B82Y 35/00; B82Y 99/00; Y10S 977/742; Y10S 977/843; D01F 9/10; D01F 9/127; D01F 9/1271; D01F 9/1272; D01F 9/1273; D01F 9/1274; D01F 9/1275; D01F 9/1276; D01F 9/1277; D01F 9/1278

See application file for complete search history.

(56) References Cited

U.S. PATENT DOCUMENTS

| | | | |
|---|---|---|---|
| 2004/0141906 | A1 | 7/2004 | Polverejan et al. |
| 2007/0253890 | A1 | 11/2007 | Nakayama et al. |
| 2009/0110627 | A1 | 4/2009 | Choi et al. |
| 2009/0130325 | A1 | 5/2009 | Hirakuri et al. |
| 2010/0159222 | A1 | 6/2010 | Hata et al. |
| 2010/0196249 | A1* | 8/2010 | Hata ..................... B82Y 30/00 423/447.2 |
| 2010/0196600 | A1 | 8/2010 | Shibuya et al. |

FOREIGN PATENT DOCUMENTS

| | | | |
|---|---|---|---|
| JP | 2001192204 | A | 7/2001 |
| JP | 2003277029 | A | 10/2003 |
| JP | 2009127059 | A | 6/2009 |
| JP | 2012530663 | A | 12/2012 |
| JP | 2013086993 | A | 5/2013 |
| WO | 2005118473 | A1 | 12/2005 |
| WO | 2008128437 | A1 | 10/2008 |
| WO | 2010147656 | A2 | 12/2010 |

OTHER PUBLICATIONS

May 22, 2017, Extended European Search Report issued by the European Patent Office in the corresponding European Patent Application No. 14846980.2.

Plata, D. L. et al; Multiple Alkynes React with Ethylene to Enhance Carbon Nanotube Synthesis, Suggesting a Polymerization-like Formation Mechanism; ACS Nano 2010; 4 (12); 7185-7192.

Suda, et al., Carbon-nanotube Growth in Alcohol-Vapor Plasma, IEEE Transactions on Plasma Science 2009; 37(7): 1150-1155.

Sugime, H. et al.; Cold-gas Chemical Vapor Deposition to Identify the Key Precursor for Rapidly Growing Vertically-aligned Single-wall and Few-wall Carbon Nanotubes from Pyrolyzed Ethanol; Carbon 2012; 50 (8); 2953-2960.

Zhong, G. et al; Acetylene: A Key Growth Precursor for Single-Walled Carbon Nanotube Forests; J. Phys. Chem. C 2009; 113 (40); 17321-17325.

Sep. 27, 2018, Communication pursuant to Article 94(3) EPC issued by the European Patent Office in the corresponding European Patent Application No. 14846980.2.

Tarek M. Abdel-Fattah et al., "Chemical Vapor Deposition Synthesis of Carbon Nanotubes Using Iron Catalysts", ECS Transactions, Jan. 1, 2010, pp. 1 to 6, XP055371995, US, ISSN: 1938-5862, DOI: 10.1 149/1.3299284.

* cited by examiner

FIG. 7
(A)
Comparative Example 1
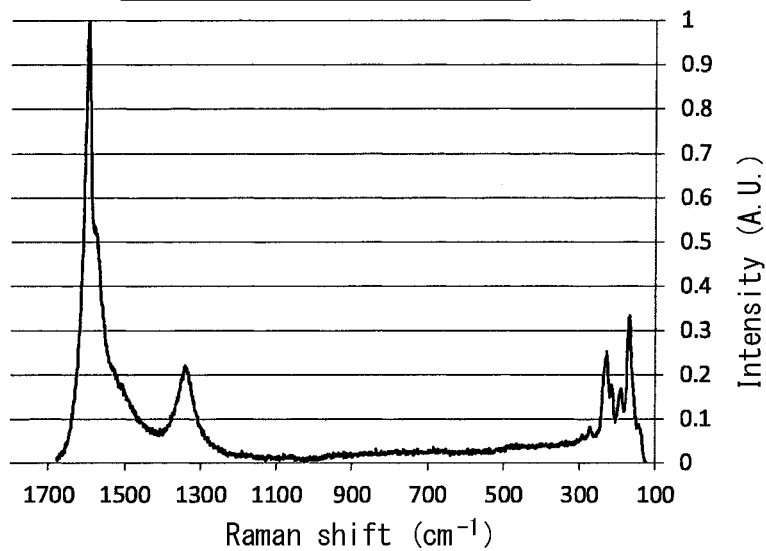
(B)
Comparative Example 1
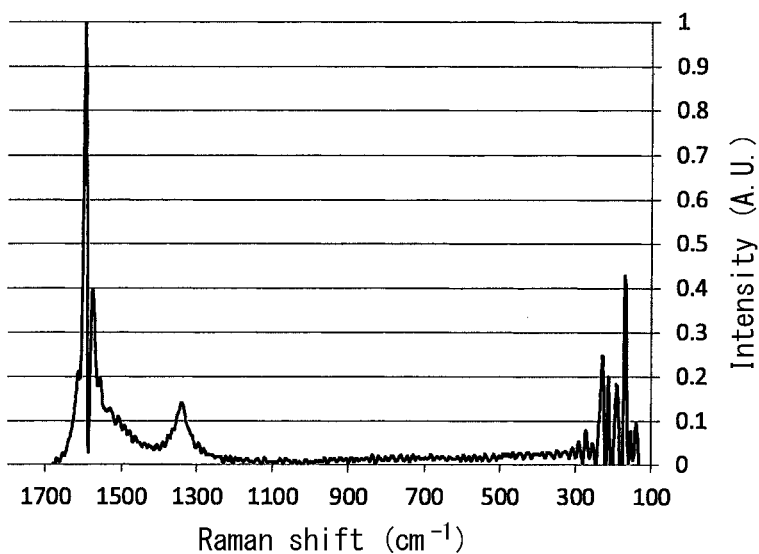

FIG. 8
(A)
Example 11-1
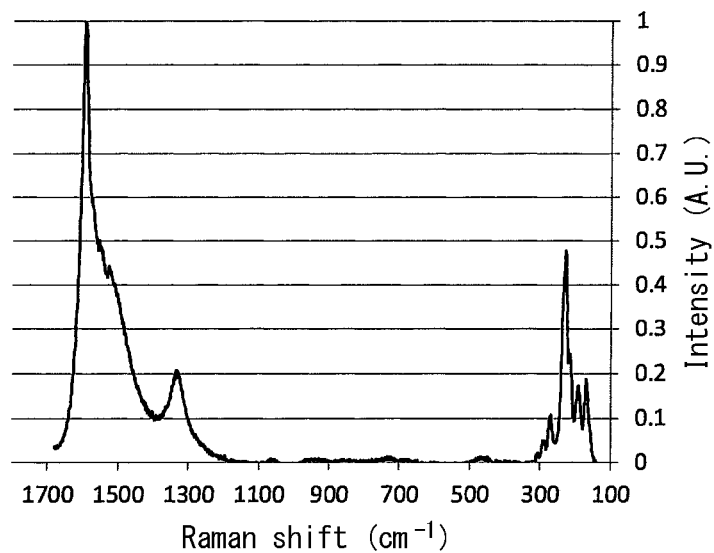
(B)
Example 11-1
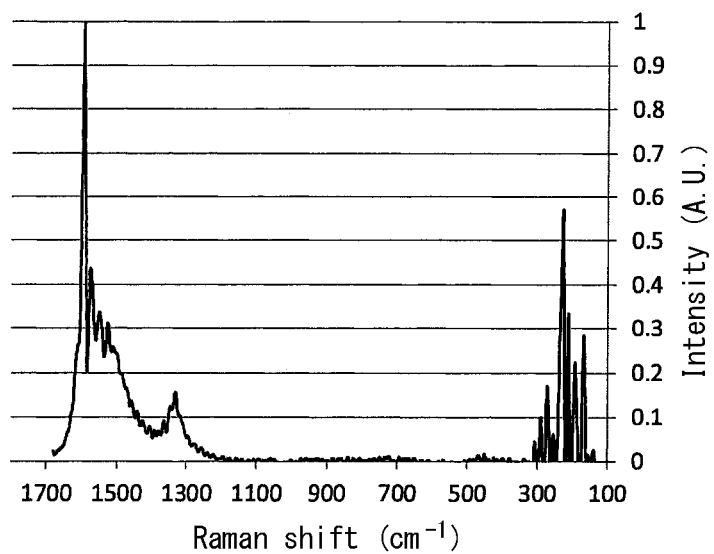

FIG. 9
(A)
Example 11-2
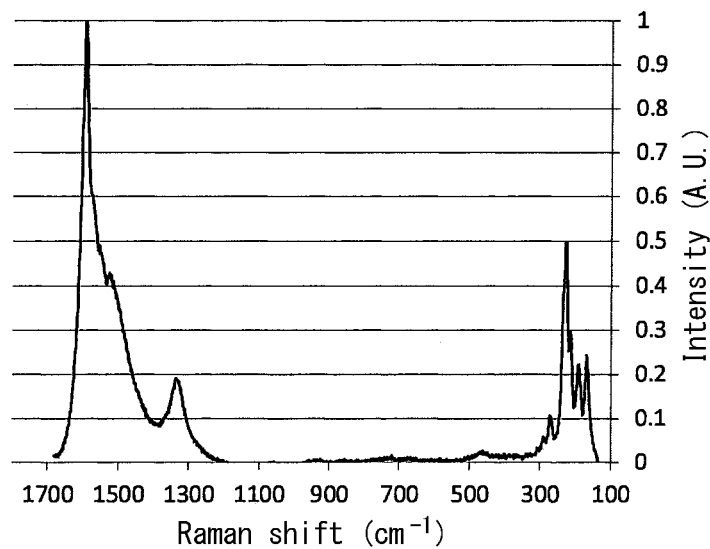
(B)
Example 11-2
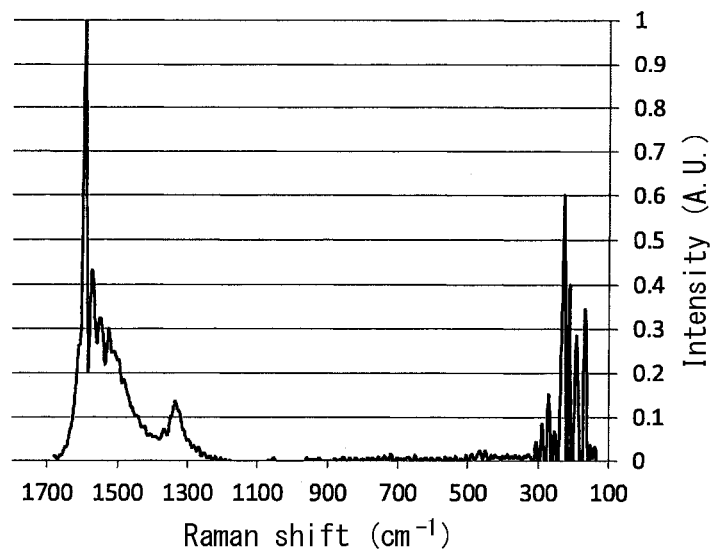

FIG. 10
(A)
Example 11-3
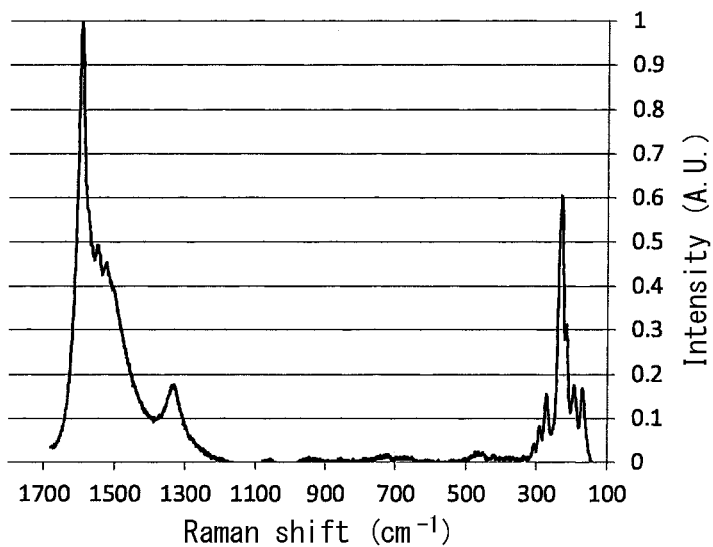
(B)
Example 11-3
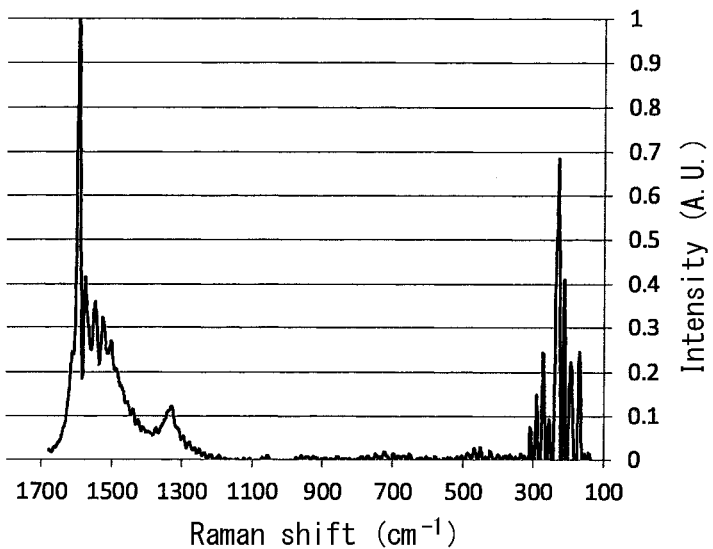

FIG. 11
(A)
Example 11-4
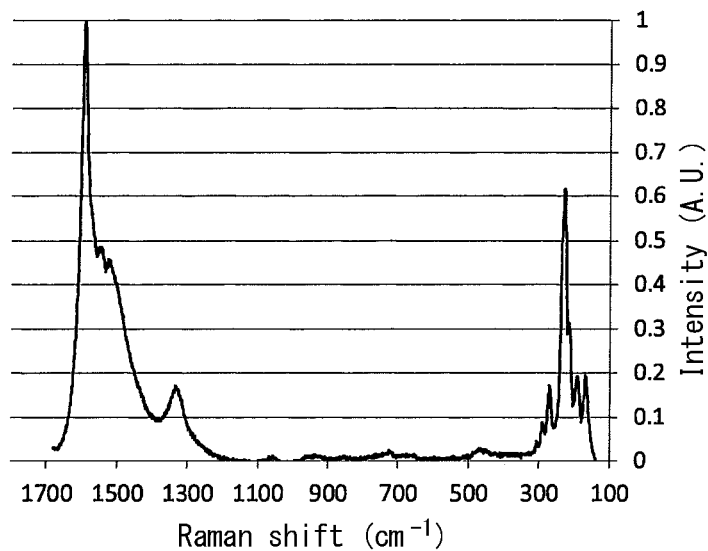
(B)
Example 11-4
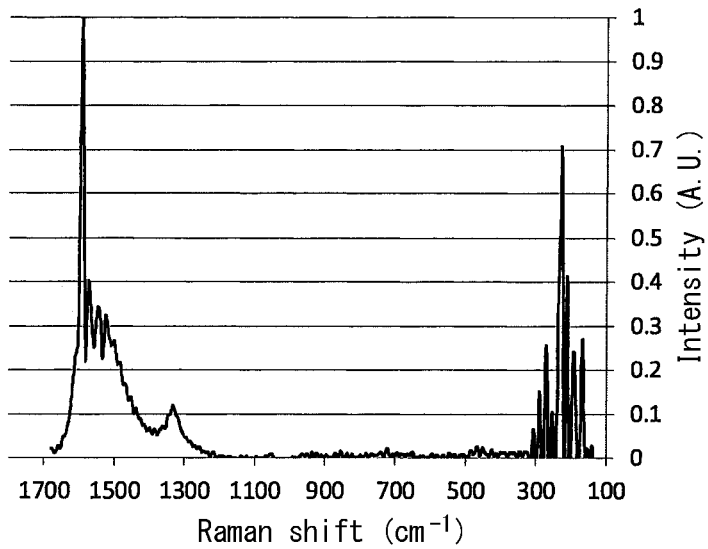

FIG. 13
(A)
Example 2-2
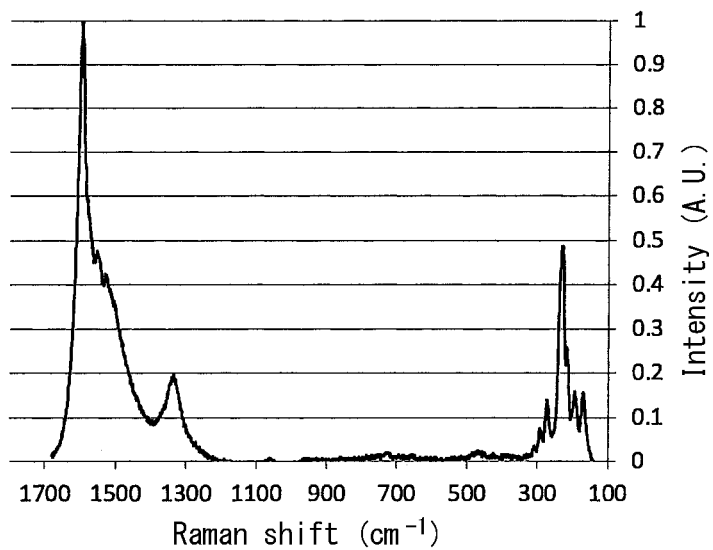
(B)
Example 2-2
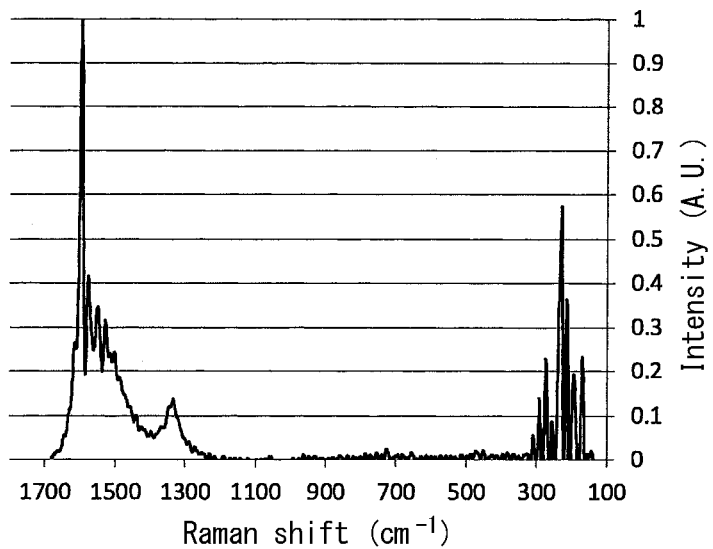

FIG. 14
(A)
Example 2-3
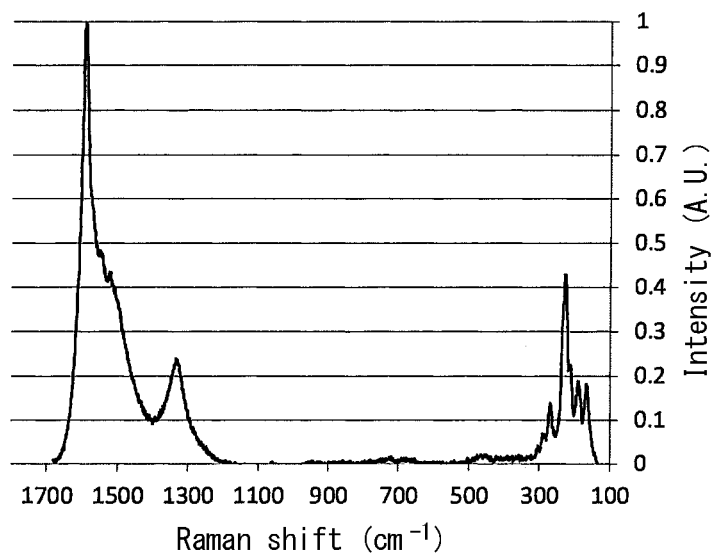
(B)
Example 2-3
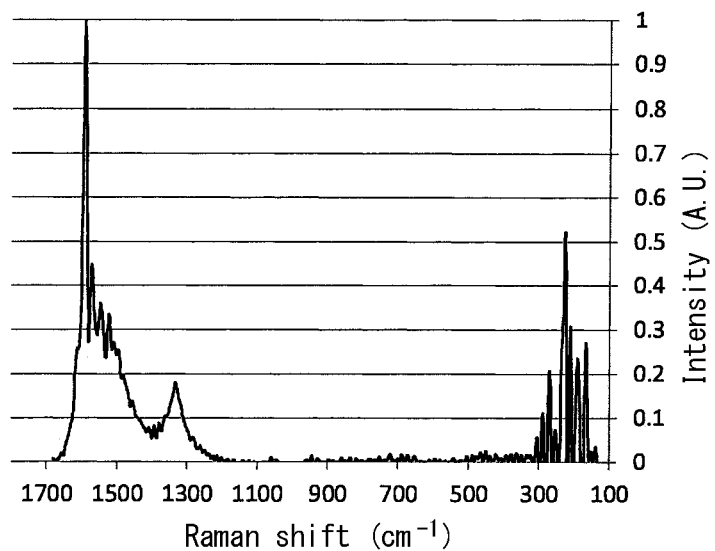

METHOD OF PRODUCING CARBON NANOSTRUCTURES, AND CARBON NANOTUBES

CROSS-REFERENCE TO RELATED APPLICATION

This application is a divisional application of U.S. application Ser. No. 15/021,743 filed on Mar. 14, 2016, which is a National Stage of International Application No. PCT/JP2014/005009 filed on Sep. 30, 2014, which claims priorities of Japanese Patent Application No. 2013-205931 filed on Sep. 30, 2013, Japanese Patent Application No. 2013-205933 filed on Sep. 30, 2013, and Japanese Patent Application No. 2013-205934 filed on Sep. 30, 2013. The entire disclosures of the prior applications are incorporated into the present application by reference.

TECHNICAL FIELD

The present disclosure relates to a method of producing a carbon nanostructure, and relates to carbon nanotubes.

BACKGROUND

Carbon nanostructures are attracting attention as core materials in nanotechnology. In the present disclosure, the term "carbon nanostructure" is used to refer to a nano-sized material composed of carbon atoms. Examples include coil-shaped carbon nanocoils, tube-shaped carbon nanotubes (also referred to below as "CNTs"), carbon nanotwists in which CNTs are twisted, bead-supporting CNTs in which beads are formed on CNTs, carbon nanobrushes composed of numerous stood-up CNTs, spherical shell-shaped fullerenes, graphene, and thin films of diamond-like carbon. Such carbon nanostructures are related in terms that a nanostructure containing $sp^2$ hybridized carbon is deposited on the surface of a metal (catalyst) by chemical vapor deposition and there are many analogies in the production methods of such carbon nanostructures.

A currently known method involves supplying a feedstock gas to a catalyst and growing a carbon nanostructure by chemical vapor deposition (also referred to below as "CVD"). In the method described above, a feedstock gas including a carbon compound is supplied to fine metal particles serving as a catalyst at a high ambient temperature of approximately 500° C. to 1,000° C. Various carbon nanostructures can be produced through the above-described method by making various alterations to the catalyst type, catalyst positioning, feedstock gas type, reaction conditions, and so forth.

For example, PTL 1 discloses a method in which methane ($CH_4$) or ethylene ($C_2H_4$) is used as a feedstock gas and in which CNTs are produced through CVD in a state in which the catalyst is in contact with an alkyne-containing gas. PTL 2 discloses a method in which a hydrocarbon gas such as methane, ethylene, or acetylene ($C_2H_2$) is used as a feedstock gas and in which CNTs are produced through CVD by blowing the feedstock gas onto the catalyst.

CNT production techniques using CVD are advantageous in terms that both single-walled carbon nanotubes (SWCNTs) and multi-walled carbon nanotubes (MWCNTs) can be produced and that use of a substrate with a catalyst supported thereon enables production of numerous CNTs that are oriented perpendicularly to the substrate surface. One method suitable for CNT mass production that has attracted much interest since development thereof is a super growth method in which a feedstock gas is brought into contact with a catalyst together with a catalyst activating material such as water.

It should be noted that although the chemical reaction mechanism by which CNTs are synthesized through CVD is not yet fully understood, a number of research studies have reported that acetylene (alkyne) is an effective molecule in CNT synthesis (in other words, a molecule that actually serves as a CNT precursor). For example, NPL 1 asserts that acetylene serves directly as a CNT precursor based on the results of an experiment in which plasma/thermal CVD was carried out using methane as a carbon feedstock. NPL 2 proposes that a polymerization reaction of ethylene and an alkyne, such as acetylene, is an efficient CNT synthesis mechanism based on the results of an experiment in which thermal CVD was carried out using ethylene as a carbon feedstock. NPL 3 asserts that acetylene is an effective CNT precursor based on the results of an experiment in which thermal CVD was carried out using ethanol as a carbon feedstock.

It can be inferred from the preceding studies described above that it is highly probable that feedstock gases conventionally known to be suitable for CNT synthesis (methane, ethylene, and ethanol) are not precursors that contribute directly to CNT synthesis and that it is also highly probable that acetylene (alkyne) serves as a CNT precursor.

CITATION LIST

Patent Literature

PTL 1: WO2010/147656A2 (JP2012-530663A)
PTL 2: WO05/118473A1 (specification of US2007/253890A1)

Non-Patent Literature

NPL 1: Zhong, G. et al; Acetylene: A Key Growth Precursor for Single-Walled Carbon Nanotube Forests; J. Phys. Chem. C 2009; 113 (40); 17321-17325
NPL 2: Plata, D. L. et al; Multiple Alkynes React with Ethylene to Enhance Carbon Nanotube Synthesis, Suggesting a Polymerization-like Formation Mechanism; ACS Nano 2010; 4 (10); 7185-7192
NPL 3: Sugime, H. et al, Cold-gas Chemical Vapor Deposition to Identify the Key Precursor for Rapidly Growing Vertically-aligned Single-wall and Few-wall Carbon Nanotubes from Pyrolyzed Ethanol; Carbon 2012; 50 (8); 2953-2960

SUMMARY

Technical Problem

However, it is known that when the volume concentration of acetylene supplied to a catalyst is increased in CNT production through CVD, once a certain concentration (approximately 0.5% to 1.5%) or higher is reached, the yield of synthesized CNTs reaches a substantially saturated state. Furthermore, the yield and quality (specific surface area and G/D described further below) of synthesized CNTs have an inverse correlation. Consequently, supplying acetylene to the catalyst in a concentration equal to or higher than the saturation volume concentration in an attempt to increase the yield is problematic because there is a dramatic reduction in specific surface area and G/D without much of an increase in the yield. Therefore, there is demand for a CVD production technique that can increase the yield while maintaining quality; this demand is not sufficiently met by a conventional technique in which a gas supplied to a catalyst simply includes acetylene as a molecule effective in CNT synthesis.

In light of the problem described above, the present disclosure aims to provide a carbon nanostructure production method that can be used to produce a high-quality carbon nanostructure with a high yield.

Solution to Problem

The inventor reached the following findings as a result of diligent research conducted in order to accomplish the above aim. That is to say, the inventor focused on the composition of gas that actually comes into contact with the catalyst (also referred to below simply as "contacting gas"), rather than on the feedstock gas. Specifically, the inventor identified new CNT precursors, other than acetylene, that are present among numerous hydrocarbon gases produced when ethylene, which is one type of conventionally used feedstock gas, undergoes thermal decomposition in CVD. The inventor specifically discovered that the efficiency of CNT synthesis is substantially improved when the contacting gas is a mixed gas of a hydrocarbon A having at least one cyclopentadiene skeleton and a hydrocarbon B having at least one acetylene skeleton, and when the hydrocarbon A is included in a specific volume concentration.

The following carbon nanostructure production method (1) was achieved based on the above findings.

(1) A method of producing a carbon nanostructure including supplying a feedstock gas to a catalyst and growing a carbon nanostructure by chemical vapor deposition, wherein a gas X that is derived from the feedstock gas and that comes into contact with the catalyst contains a hydrocarbon A having at least one cyclopentadiene skeleton and a hydrocarbon B having at least one acetylene skeleton, and a total volume concentration [A] of the hydrocarbon A is at least 0.06%.

In particular, a high-quality carbon nanostructure can be produced in a high yield through the following carbon nanostructure production methods (2) and (3).

(2) The method of producing a carbon nanostructure described above in (1), wherein the total volume concentration [A] of the hydrocarbon A is at least 0.2% and a total volume concentration [B] of the hydrocarbon B is at least 0.01%.

(3) The method of producing a carbon nanostructure described above in (2), wherein the gas X satisfies $0.2 \leq [A]/[B] \leq 100$.

The following carbon nanostructure production method (4) enables efficient production of carbon nanotubes having high purity, high specific surface area, and high metallic carbon nanotube content.

(4) The method of producing a carbon nanostructure described above in (1), wherein the total volume concentration [A] of the hydrocarbon A and a total volume concentration [B] of the hydrocarbon B satisfy $0.3 \leq [A]/[B] \leq 1{,}000$.

A single-walled CNT may be a semiconducting CNT or a metallic CNT depending on a difference in the wrapping (helicity) of a graphene sheet in which carbon atoms are arranged. CNT production by a conventional CVD method is generally non-selective in terms of semiconducting CNTs and metallic CNTs (assuming that semiconducting and metallic CNTs have the same probability of being synthesized, it can be calculated that among CNTs of approximately the same diameter, the number of metallic CNTs will be approximately ½ to ¼ of the number of semiconducting CNTs). The same has been true for the super growth method which can produce single-walled CNTs having high purity and high specific surface area.

In recent years, however, metallic CNTs have attracted interest as, for example, an alternative to indium tin oxide (ITO) in transparent conductive thin-films. As a consequence of such development of further uses for single-walled CNTs having metallic properties, there is a demand for raising the metallic CNT content in synthesized CNTs while maintaining conditions of high purity and high specific surface area. Although there is of course ongoing investigation into techniques for isolating semiconducting CNTs and metallic CNTs from synthesized CNTs, increasing the metallic CNT content from the synthetic stage is of greatest importance. CNTs having high purity, high specific surface area, and high metallic CNT content can be efficiently produced through the carbon nanostructure production method (4) described above.

The following carbon nanostructure production methods (5) to (7) enable even more efficient production of CNTs in addition to the effects of the carbon nanostructure production methods (1) to (4).

(5) The method of producing a carbon nanostructure described above in any one of (1) to (4), wherein the gas X further contains either or both of a catalyst activating material and molecular hydrogen.

(6) The method of producing a carbon nanostructure described above in any one of (1) to (5), wherein the gas X further contains a hydrocarbon C having at least one allene skeleton.

(7) The method of producing a carbon nanostructure described above in (6), wherein the hydrocarbon C is either or both of propadiene and 1,2-butadiene.

The inventor also discovered a suitable feedstock gas composition for realizing the contacting gas composition in the above-described carbon nanostructure production method (1). Specifically, the inventor discovered that by using a mixed gas of a hydrocarbon A' having at least one carbocycle with a carbon number of 5 and a hydrocarbon B' having at least one acetylene skeleton as the feedstock gas, the effective CNT precursors described above can be obtained as significant components in the contacting gas and, as a result, a high-quality carbon nanostructure can be produced with high efficiency.

The inventor also discovered that when the feedstock gas described above is used, exhaust tar (aggregates of VOCs, PAHs, etc.) produced by side reactions can be reduced to approximately ½ and the rate of substrate carburization can be reduced to approximately ¼ of that when a conventional ethylene feedstock gas is used.

The following carbon nanostructure production methods (8) to (11) were achieved based on the above findings.

(8) A method of producing a carbon nanostructure including supplying a feedstock gas to a catalyst and growing a carbon nanostructure by chemical vapor deposition, wherein the feedstock gas contains a hydrocarbon A' having at least one carbocycle with a carbon number of 5 and a hydrocarbon B' having at least one acetylene skeleton.

(9) The method of producing a carbon nanostructure described above in (8), wherein when a total volume concentration of the hydrocarbon A' is represented by [A'] and a total volume concentration of the hydrocarbon B' is represented by [B'], the feedstock gas satisfies $$0.1 \leq [A']/[B'] \leq 100.$$

(10) The method of producing a carbon nanostructure described above in (8) or (9), wherein the hydrocarbon A' is one or more selected from the group consisting of cyclopentadiene, dicyclopentadiene, cyclopentene, norbornene, norbornadiene, and cyclopentane, and the hydrocarbon B' is one or more selected from the group consisting of acetylene, methylacetylene, vinylacetylene, 1-butyne, 2-butyne, isopropylacetylene, and isopropenylacetylene.

(11) The method of producing a carbon nanostructure described above in any one of (8) to (10), wherein the feedstock gas further contains either or both of a catalyst activating material and molecular hydrogen.

As a consequence of the relatively high carbon concentration in the feedstock gas during CNT production by CVD, large amounts of high molecular weight hydrocarbons, such as volatile organic compounds (VOCs) and polycyclic aromatic hydrocarbons (PAHs), are produced through side reactions. When continuous production is performed, such high molecular weight hydrocarbons induce exhaust pipe blocking and are a major cause of reduced production efficiency. Furthermore, performance of CNT production over an extended period of time causes excessive substrate carburization, leading to problems such as necessity of early substrate or component replacement, mixing of impurities into products, and reduced quantity and quality of produced CNTs, and is a major cause of reduced production efficiency. However, production of side reaction products and substrate carburization can be suppressed and a high-quality carbon nanostructure can be produced with high efficiency through the carbon nanostructure production methods (8) to (11).

The following carbon nanostructure production methods (12) and (13) are more preferable embodiments.

(12) The method of producing a carbon nanostructure described above in any one of (1) to (11), wherein the catalyst is supported on a substrate surface and the feedstock gas is supplied to the catalyst by a gas shower.

(13) The method of producing a carbon nanostructure described above in any one of (1) to (12), wherein the carbon nanostructure is a carbon nanotube.

The following CNTs (14) to (16) are highly suitable for production by the above-described carbon nanostructure production method (4). The CNTs have high purity, high specific surface area, and high metallic CNT content.

(14) Carbon nanotubes having a specific surface area of from 600 m$^2$/g to 2,500 m$^2$/g and having a purity of at least 98% according to X-ray fluorescence measurement, wherein in a Raman spectrum measured by resonance Raman scattering at an excitement wavelength of 532 nm, $$0.6 \leq \left( \sum_{k=1}^{n} I^k_{BFW} \right) \bigg/ I_{G+} \qquad \text{[Math 1]}$$

where $I_{G+}$ represents intensity of a G+ band peak appearing near 1590 cm$^{-1}$, $I^k_{BWF}$ represents intensity of a $k^{th}$ G− band peak among n G− band peaks appearing in a range from 1500 cm$^{-1}$ to 1560 cm$^{-1}$, and n represents an integer of at least 1.

(15) The carbon nanotubes described above in (14), wherein a largest peak among RBM peaks appearing in a range from 100 cm$^{-1}$ to 350 cm$^{-1}$ in the Raman spectrum is in a range from 200 cm$^{-1}$ to 270 cm$^{-1}$.

(16) The carbon nanotubes described above in (14) or (15), wherein a central diameter size is from 1 nm to 5 nm.

Advantageous Effect

The presently disclosed carbon nanostructure production method enables highly efficient production of a high-quality carbon nanostructure.

BRIEF DESCRIPTION OF THE DRAWINGS

In the accompanying drawings:

FIG. 7 illustrates a Raman spectrum (A) and a spectrum after deconvolution analysis (B) for CNTs of Comparative Example 1;

FIG. 8 illustrates a Raman spectrum (A) and a spectrum after deconvolution analysis (B) for CNTs of Example 11-1;

FIG. 9 illustrates a Raman spectrum (A) and a spectrum after deconvolution analysis (B) for CNTs of Example 11-2;

FIG. 10 illustrates a Raman spectrum (A) and a spectrum after deconvolution analysis (B) for CNTs of Example 11-3;

FIG. 11 illustrates a Raman spectrum (A) and a spectrum after deconvolution analysis (B) for CNTs of Example 11-4;

FIG. 13 illustrates a Raman spectrum (A) and a spectrum after deconvolution analysis (B) for CNTs of Example 2-2; and FIG. 14 illustrates a Raman spectrum (A) and a spectrum after deconvolution analysis (B) for CNTs of Example 2-3.

DETAILED DESCRIPTION

Figure 1:
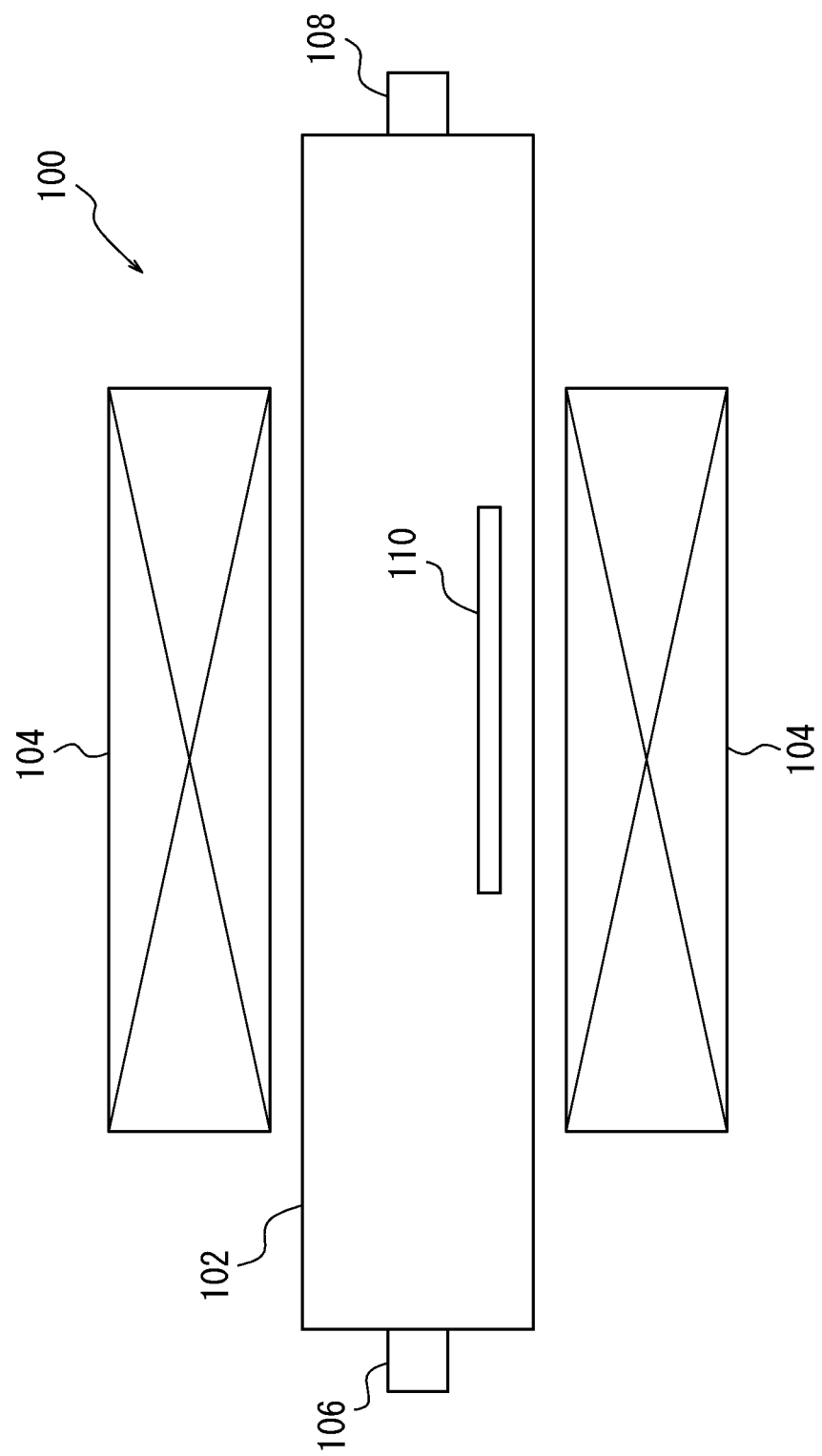
FIG. 1 is a schematic view illustrating an example of configuration of a CNT production apparatus that is applicable to the present disclosure.

The following explains embodiments of the presently disclosed carbon nanostructure production method with reference to the drawings. In a production method of a present embodiment, a feedstock gas is supplied to a substrate having a catalyst layer on the surface thereof (referred to below as a "catalyst substrate") and CNTs are grown on the catalyst layer through chemical vapor deposition. A large number of the CNTs are oriented approximately perpendicularly to the substrate on the catalyst layer to form an aggregate. The aggregate is referred to as an "aligned CNT aggregate" in the present description. Furthermore, a product obtained by peeling the aligned CNT aggregate as one from the catalyst substrate is referred to as "CNTs" in the present description.

(Substrate)

The substrate used for the catalyst substrate is for example preferably a flat plate-shaped member that maintains the same shape at a high-temperature of 500° C. or higher. Specific examples of the substrate include metals such as iron, nickel, chromium, molybdenum, tungsten, titanium, aluminum, manganese, cobalt, copper, silver, gold, platinum, niobium, tantalum, lead, zinc, gallium, indium, germanium, and antimony, alloys and oxides of any of the preceding metals, non-metals such as silicon, quartz, glass, mica, graphite, and diamond, and ceramics. Metal materials are preferable due to low cost and ease of processing compared to silicon and ceramics. Particularly suitable examples include Fe—Cr (iron-chromium) alloy, Fe—Ni (iron-nickel) alloy, and Fe—Cr—Ni (iron-chromium-nickel) alloy.

Examples of forms of the substrate include a flat plate-shape, a thin-film-shape, a block-shape, a wire-shape, a mesh-shape, and a particulate/fine particulate/powder-shape. In particular, a shape having a large surface area to volume ratio is advantageous for producing a large amount of CNTs. No specific limitations are placed on the thickness of the flat plate-shaped substrate, which may for example range from a thin-film having a micrometer-scale thickness to a plate having a centimeter-scale thickness. The thickness is preferably at least 0.05 mm and no greater than 3 mm.

(Catalyst)

In the catalyst substrate, a catalyst layer is formed on the substrate (in a situation in which a carburizing prevention layer is provided on the substrate, the catalyst layer is formed on the carburizing prevention layer). The catalyst may be any catalyst that can be used in CNT production and examples thereof include iron, nickel, cobalt, molybdenum, and chlorides and alloys thereof. Alternatively, the catalyst may be a composite or laminate of any of the above examples with aluminum, alumina, titania, titanium nitride, or silicon oxide. For example, the catalyst may be an iron-molybdenum thin-film, an alumina-iron thin-film, an alumina-cobalt thin-film, an alumina-iron-molybdenum thin-film, an aluminum-iron thin-film, or an aluminum-iron-molybdenum thin-film. The amount of the catalyst that is present is in a range that enables CNT production. For example, in the case of iron, the film-thickness is preferably at least 0.1 nm and no greater than 100 nm, more preferably at least 0.5 nm and no greater than 5 nm, and particularly preferably at least 0.8 nm and no greater than 2 nm.

The catalyst layer may be formed on the surface of the substrate by a wet process or a dry process (for example, sputtering deposition). However, a wet process is preferable in terms of simplicity of film formation equipment (i.e., there is no requirement for a vacuum process), throughput speed, and low cost of raw materials.

(Catalyst Formation Wet Process)

A wet process for forming the catalyst layer normally includes a step in which a coating agent is applied onto a substrate and a subsequent heating step; the coating agent includes an organic solvent and, dissolved therein, an organometallic compound and/or metal salt including an element that serves as a catalyst. A stabilizer may be added to the coating agent in order to suppress excessive polycondensation of the organometallic compound and the metal salt.

The application step may for example be carried out by spin coating, dip coating, or through application by spraying or by a brush, although dip coating is preferable for producibility and control of film-thickness.

The heating step is preferably carried out after the application step. Heating initiates hydrolysis and polycondensation of the organometallic compound and the metal salt and causes a cured film containing the organometallic compound and/or metal salt to be formed on the surface of the substrate. The heating temperature is preferably appropriately adjusted in a range of approximately 50° C. to 400° C. and the heating time is preferably appropriately adjusted in a range of from 5 minutes to 3 hours depending on the type of catalyst thin-film that is to be formed.

In an example in which an alumina-iron thin-film is to be formed as the catalyst, an iron thin-film is formed after forming an alumina film.

Examples of the organometallic compound and/or metal salt used to form the alumina thin-film include aluminum alkoxides such as aluminum trimethoxide, aluminum triethoxide, aluminum tri-n-propoxide, aluminum tri-i-propoxide, aluminum tri-n-butoxide, aluminum tri-sec-butoxide, and aluminum tri-tert-butoxide. Other examples of organometallic compounds containing aluminum include complexes such as tris(acetylacetonato)aluminum(III). Examples of the metal salt include aluminum sulfate, aluminum chloride, aluminum nitrate, aluminum bromide, aluminum iodide, aluminum lactate, basic aluminum chloride, and basic aluminum nitrate. Among the examples given above, use of an aluminum alkoxide is preferable. Any one of the examples listed above or a mixture of any two or more of the examples listed above may be used.

Examples of the organometallic compound and/or metal salt used to form the iron thin-film include iron pentacarbonyl, ferrocene, iron(II) acetylacetonate, iron(III) acetylacetonate, iron(II) trifluoroacetylacetonate, and iron(III) trifluoroacetylacetonate. Examples of the metal salt include inorganic acid iron salts such as iron sulfate, iron nitrate, iron phosphate, iron chloride, and iron bromide, and organic acid iron salts such as iron acetate, iron oxalate, iron citrate, and iron lactate. Among the above examples, use of an organic acid iron salt is preferable. Any one of the examples listed above or a mixture of any two or more of the examples listed above may be used.

The stabilizer is preferably one or more selected from the group consisting of β-diketones and alkanolamines. Any one of such compounds or a mixture of any two or more of such compounds may be used. Examples of β-diketones that can be used include acetylacetone, methyl acetoacetate, ethyl acetoacetate, benzoylacetone, dibenzoylmethane, benzoyltrifluoroacetone, furoylacetone, and trifluoroacetylacetone, with acetylacetone and ethyl acetoacetate being particularly preferable. Examples of alkanolamines that can be used include monoethanolamine, diethanolamine, triethanolamine, N-methyldiethanolamine, N-ethyldiethanolamine, N,N-dimethylaminoethanol, diisopropanolamine, and triisopropanolamine, with a secondary or tertiary alkanolamine being preferable.

Although various organic solvents such as alcohols, glycols, ketones, ethers, esters, and hydrocarbons can be used, the organic solvent is preferably an alcohol or a glycol in order to enable favorable organometallic compound and metal salt solubility. Any one of the organic solvents listed above or a mixture of any two or more of the organic solvents listed above may be used. Alcohols that are preferable in terms of handling and preservation stability include methanol, ethanol, and 2-propanol.

The amount of the organometallic compound and/or metal salt included in the coating agent is normally from 0.05% by mass to 0.5% by mass, and preferably from 0.1% by mass to 0.5% by mass.

(Formation Step)

In the presently disclosed production method, a formation step is preferably performed before a growth step. The formation step involves providing a reducing gas environment as a surrounding environment of the catalyst and heating either or both of the catalyst and the reducing gas. The step described above leads to one or more effects among catalyst reduction, promotion of micronization of the catalyst to a state suitable for CNT growth, and improvement of catalyst activity. For example, in a situation in which the catalyst is an alumina-iron thin-film, the iron catalyst is reduced and micronized such that numerous nanometer-size fine iron particles are formed on the alumina layer. As a result, the catalyst is placed in a highly suitable state for aligned CNT aggregate production. Although CNTs can still be produced even if the formation step is omitted, the formation step enables a dramatic improvement in production yield and quality of the aligned CNT aggregate.

The reductive gas (reducing gas) is a gas that can be used in CNT production and examples thereof include hydrogen gas, ammonia, water vapor, and mixed gases of any of the preceding gases. A mixed gas in which hydrogen gas is mixed with an inert gas such as helium gas, argon gas, or nitrogen gas may be used as the reducing gas. Besides use in the formation step, the reducing gas may also be used in the growth step as appropriate.

(Growth Step)

The growth step involves growing an aligned CNT aggregate on the catalyst by providing a feedstock gas environment as a surrounding environment of the catalyst and heating either or both of the catalyst and the feedstock gas. It is preferable that at least the catalyst is heated from a viewpoint of growing high-quality CNTs. The heating temperature is preferably from 400° C. to 1,100° C. The growth step is carried out by introducing a feedstock gas that includes an inert gas and that optionally includes either or both of a reducing gas and a catalyst activating material into a CNT growth furnace that houses the catalyst substrate.

<Contacting Gas>

One main feature of the production method of the present embodiment is a gas X that comes into contact with the catalyst in the growth step. The gas X includes various hydrocarbon gases resulting from decomposition of the feedstock gas, feedstock gas that reaches the catalyst without decomposing, the inert gas, and the optionally included reducing gas and/or catalyst activating material.

In the present embodiment, it is essential that the gas X includes a hydrocarbon A having at least one cyclopentadiene skeleton and a hydrocarbon B having at least one acetylene skeleton, and that the total volume concentration [A] of the hydrocarbon A is at least 0.06%. As a result of the hydrocarbon A and the hydrocarbon B both being present in the gas X and the volume concentration being as described above, the yield can be increased while maintaining CNT quality. It should be noted that in the present description, a hydrocarbon having at least one cyclopentadiene skeleton may be referred to as a "cyclopentadiene compound" and a hydrocarbon having at least one acetylene skeleton may be referred to as an "acetylene compound."

The hydrocarbon A having at least one cyclopentadiene skeleton can for example be one or more selected from the group consisting of cyclopentadiene, methylcyclopentadiene, dimethylcyclopentadiene, trimethylcyclopentadiene, tetramethylcyclopentadiene, pentamethylcyclopentadiene, ethylcyclopentadiene, and radicals thereof. However, cyclopentadiene and methylcyclopentadiene are preferable from a viewpoint of structural stability at the temperature of CNT growth.

The hydrocarbon B having at least one acetylene skeleton can for example be one or more selected from the group consisting of acetylene, methylacetylene (propyne), vinylacetylene, 1-butyne (ethylacetylene), 2-butyne, diacetylene, isopropylacetylene, isopropenylacetylene, 1-pentyne, 2-pentyne, isopentyne, cyclopropenylacetylene, methylvinylacetylene, propenylacetylene, phenylacetylene, hexynes, hexadiynes, and radicals thereof. However, acetylene, methylacetylene, vinylacetylene, 2-butyne, and phenylacetylene are preferable from a viewpoint of structural stability at the temperature of CNT growth.

In the present embodiment, it is particularly important that the gas X that comes into contact with the catalyst includes the hydrocarbon A as a CNT precursor. Therefore, the total volume concentration [A] of the hydrocarbon A in the gas X is stipulated to be at least 0.06% and preferably at least 0.2%. From a viewpoint of achieving the presently disclosed effects to more sufficient extent, the total volume concentration [A] is more preferably at least 0.3% and particularly preferably at least 0.4%. An upper limit for the total volume concentration [A] tends to be proportional to catalyst density in the furnace and can be as high as 99%. In a situation in which the catalyst substrate is a flat plate, the total volume concentration [A] is normally no greater than 10%, preferably no greater than 5%, and more preferably no greater than 2%. If the amount of the hydrocarbon A is excessive relative to the catalyst density, carbon impurities such as amorphous carbon may be produced to an extent that, depending on the intended use, such carbon impurities are not negligible.

The hydrocarbon B preferably has a total volume concentration [B] of at least 0.01% in the gas X, which enables increased yield while maintaining CNT quality. From a viewpoint of achieving such effects to a more sufficient extent, the total volume concentration [B] is more preferably at least 0.05% and particularly preferably at least 0.1%. An upper limit for the total volume concentration [B] tends to be proportional to catalyst density in the furnace and can be as high as 83%. In a situation in which the catalyst substrate is a flat plate, the total volume concentration [B] is normally no greater than 10%, preferably no greater than 5%, and more preferably no greater than 2%. If the amount of the hydrocarbon B is excessive relative to the catalyst density, carbon impurities such as amorphous carbon may be produced to an extent that, depending on the intended use, such carbon impurities are not negligible.

From a viewpoint of achieving the presently disclosed effects to a more sufficient extent, [A]/[B] is preferably at least 0.2 and no greater than 100, more preferably at least 0.3 and no greater than 50, and most preferably at least 0.4 and no greater than 20.

In another presently disclosed embodiment, it is essential that the total volume concentration [A] of the hydrocarbon A and the total volume concentration [B] of the hydrocarbon B satisfy $0.3 \leq [A]/[B] \leq 1,000$ in order to efficiently produce CNTs having high purity, high specific surface area, and high metallic CNT content. As a result of the hydrocarbon A and the hydrocarbon B both being present in the gas X and the volume concentrations being as described above, the metallic CNT content can be raised.

From a viewpoint of raising the metallic CNT content, [A]/[B] is preferably at least 0.4 and no greater than 1,000, and more preferably at least 0.5 and no greater than 1,000. Furthermore, the total volume concentration [A] of the hydrocarbon A is preferably at least 0.1% and more preferably at least 0.2%. The total volume concentration [B] of the hydrocarbon B is preferably at least 0.003% and more preferably at least 0.01%.

The gas X preferably further includes a hydrocarbon C having at least one allene skeleton. As a consequence, effectiveness of CNT synthesis (i.e., yield and quality) changes more gradually in response to changes in concentration of the hydrocarbon A, which facilitates control of production conditions (i.e., improves robustness). The hydrocarbon C may for example be one or more selected from the group consisting of propadiene (allene), 1,2-butadiene, and 2,3-pentadiene. However, either or both of propadiene and 1,2-butadiene are preferable from a viewpoint of structural stability at the temperature of CNT growth. The total volume concentration of the hydrocarbon C is preferably at least 0.01% and no greater than 0.5%, and more preferably at least 0.02% and no greater than 0.2%. A hydrocarbon having at least one allene skeleton may also be referred to as an "allene compound" in the present description.

It should be noted that identification of the contacting gas and measurement of volume concentrations can be performed in the present disclosure by suction sampling a specific amount of gas near a substrate installation position and analyzing the sampled gas by gas chromatography (GC). In the sampling, the gas is rapidly cooled to a temperature at which thermal decomposition does not occur (approximately 200° C.) and is introduced into GC straight after cooling. As a result, chemical change of the sampled gas can be prevented and the composition of the gas in contact with the catalyst can be correctly measured.

<Feedstock Gas>

Another presently disclosed embodiment provides a feedstock gas composition that is highly suitable for ensuring that the two hydrocarbons A and B described above are significant components of the contacting gas X. Specifically, a feature of the present embodiment is use of a feedstock gas including a hydrocarbon A' having at least one carbocycle with a carbon number of 5 and a hydrocarbon B' having at least one acetylene skeleton. As a result of both the hydrocarbon A' and the hydrocarbon B' being used as the feedstock gas, the yield can be raised, while maintaining CNT quality, compared to a conventional technique in which ethylene is used as a hydrocarbon or compared to a situation in which one, but not both, of the hydrocarbon A' and the hydrocarbon B' is used as the feedstock gas.

The hydrocarbon A' having at least one carbocycle with a carbon number of 5 is preferably one or more selected from the group consisting of cyclopentadiene, dicyclopentadiene, cyclopentene, norbornene, norbornadiene, and cyclopentane.

The hydrocarbon B' having at least one acetylene skeleton is preferably one or more selected from the group consisting of acetylene, methylacetylene, vinylacetylene, 1-butyne, 2-butyne, isopropylacetylene, and isopropenylacetylene.

From a viewpoint of achieving the presently disclosed effects to a more sufficient extent, the total volume concentration [A'] of the hydrocarbon A' is preferably at least 0.1%, more preferably at least 0.2%, and particularly preferably at least 0.3%. An upper limit for the total volume concentration [A'] tends to be proportional to catalyst density in the furnace and can be as high as 99%. In a situation in which the catalyst substrate is a flat plate, the total volume concentration [A'] is normally no greater than 10%, preferably no greater than 5%, and more preferably no greater than 2%. If the amount of the hydrocarbon A' is excessive relative to the catalyst density, carbon impurities such as amorphous carbon may be produced to an extent that, depending on the intended use, such carbon impurities are not negligible.

From a viewpoint of achieving the presently disclosed effects to a more sufficient extent, the total volume concentration [B'] of the hydrocarbon B' is preferably at least 0.005%, more preferably at least 0.01%, and particularly preferably at least 0.05%. An upper limit for the total volume concentration [B'] tends to be proportional to catalyst density in the furnace and can be as high as 91%. In a situation in which the catalyst substrate is a flat plate, the total volume concentration [B'] is normally no greater than 10%, preferably no greater than 5%, and more preferably no greater than 2%. If the amount of the hydrocarbon B' is excessive relative to the catalyst density, carbon impurities such as amorphous carbon may be produced to an extent that, depending on the intended use, such carbon impurities are not negligible.

From a viewpoint of achieving the presently disclosed effects to a more sufficient extent, [A']/[B'] is preferably at least 0.1 and no greater than 100, more preferably at least 0.2 and no greater than 80, and most preferably at least 0.3 (or at least 0.4) and no greater than 60.

<Inert Gas>

The feedstock gas may be diluted with an inert gas. The inert gas is a gas that is inert at the temperature of CNT growth and that does not react with the grown CNTs, and preferably does not reduce activity of the catalyst. Examples of the inert gas include nitrogen, hydrogen, noble gases such as helium, argon, neon, and krypton, and mixed gases of any of the preceding gases. Alternatively, the same effects as dilution with an inert gas can be obtained without using an inert gas by reducing the overall pressure of the furnace to reduce partial pressures corresponding to the various gas concentrations.

<Catalyst Activating Material>

A catalyst activating material may be added during the CNT growth step. Addition of the catalyst activating material enables further improvement of production efficiency and purity of the CNTs. The catalyst activating material used herein is typically an oxygen-containing material and is preferably a material that does not cause substantial damage to the CNTs at the growth temperature. Effective examples include water, oxygen, ozone, acidic gases, nitrogen oxide, oxygen-containing compounds with a low carbon number such as carbon monoxide and carbon dioxide, alcohols such as ethanol and methanol, ethers such as tetrahydrofuran, ketones such as acetone, aldehydes, esters, and mixtures thereof. Among the above examples, water, oxygen, carbon monoxide, carbon dioxide, and ethers are preferable, with water, carbon monoxide, carbon dioxide, and mixtures thereof being particularly preferable.

Although no specific limitations are placed on the volume concentration of the catalyst activating material, a trace amount of the catalyst activating material is sufficient. For example, when water is used, the water content of the feedstock gas introduced into the furnace is normally from 0.001% to 1% and preferably from 0.005% to 0.1%. In such a situation, the water content of the gas X is normally from 0.001% to 1% and preferably from 0.005% to 0.1%.

In the present embodiment, the feedstock gas and the contacting gas X preferably include hydrogen gas composed of molecular hydrogen as a catalyst activating material and/or reducing gas in order to achieve the presently disclosed effects to a more sufficient extent.

The reaction rate in CVD is known to be generally influenced by the partial pressure (volume fraction×total pressure) of components involved in the reaction. On the other hand, the total pressure can be varied within a wide range because the total pressure does not directly influence the reaction rate. Although it is therefore most accurate to stipulate the concentrations of gas components in CVD conditions in units of partial pressure, the present disclosure stipulates gas component concentrations of the feedstock gas and the contacting gas as volume fractions assuming a total pressure of 1 atmosphere in the growth furnace. Therefore, when the present disclosure is applied in a situation in which the total pressure in the growth furnace is not 1 atmosphere, the gas component concentrations of the feedstock gas and the contacting gas should be corrected volume fractions of (1 atmosphere/total pressure in growth furnace)×(volume fraction in present disclosure). Note that such a situation is also included within the scope of the present disclosure as it would be obvious for a person of ordinary skill in the art to make such corrections in a situation in which the total pressure in the growth furnace is not 1 atmosphere.

<Other Conditions>

Reaction furnace pressure and processing time for the growth step are set as appropriate in consideration of other conditions. For example, the pressure can be approximately $10^2$ Pa to $10^7$ Pa and the processing time can be approximately 0.1 minutes to 120 minutes. Flow of the feedstock gas introduced into the furnace can for example be set as appropriate with reference to the examples described further below.

(Cooling Step)

The cooling step involves cooling the aligned CNT aggregate, the catalyst, and the substrate in the presence of a cooling gas after the growth step. The aligned CNT aggregate, the catalyst, and the substrate are at a high temperature after the growth step, and therefore may be oxidized upon being placed in the presence of oxygen. In order to prevent oxidation, the aligned CNT aggregate, the catalyst, and the substrate are cooled to, for example, 400° C. or lower, and preferably 200° C. or lower, in the presence of the cooling gas. The cooling gas is preferably an inert gas, with nitrogen being particularly preferable in terms of safety, cost, and so forth.

(Peeling Step)

Single-walled CNTs can be peeled from the substrate physically, chemically, or mechanically. Examples of methods that can be used include peeling by an electric field, a magnetic field, centrifugal force, or surface tension, direct mechanical peeling from the substrate, and peeling from the substrate by pressure or heating. One example of a simple peeling method involves direct peeling from the substrate by pinching using tweezers. In a more preferable example, the CNTs can be cut away from the substrate using a thin blade such as a cutter blade. In another example, the CNTs can be sucked and peeled from the substrate using a vacuum pump or cleaner. The substrate still has the catalyst thereon once peeling has been performed and can be reused to grow perpendicularly oriented single-walled CNTs.

(Production Apparatus)

So long as the production apparatus used in the production method of the present embodiment includes a growth furnace (reaction chamber) for housing the catalyst substrate and can be used to grow CNTs by CVD, no specific limitations are placed thereon. For example, the production apparatus may be a thermal CVD furnace or an MOCVD reaction furnace. From a viewpoint of increasing CNT production efficiency, the reducing gas and the feedstock gas are preferably supplied to the catalyst on the catalyst substrate by a gas shower. The following explains an example of an apparatus including a shower head that can spray a stream of gas approximately perpendicular to the catalyst substrate.

<Example of Batch Production Apparatus>

FIG. 1 schematically illustrates a CNT production apparatus 100 used in the production method of the present embodiment. The apparatus 100 includes a reaction furnace 102 made from quartz, a heater 104 such as a resistance heating coil that is provided around the reaction chamber 102, a gas supply inlet 106 for supplying the reducing gas and the feedstock gas that is connected to one end of the reaction furnace 102, an exhaust vent 108 that is connected to the other end of the reaction furnace 102, and a holder 110 made from quartz to which the substrate is fixed. Although not illustrated, control devices such as a pressure control valve and a flow control valve for controlling flow of the reducing gas and the feedstock gas are provided at appropriate locations.

<Further Example of Batch Production Apparatus>

Figure 3:
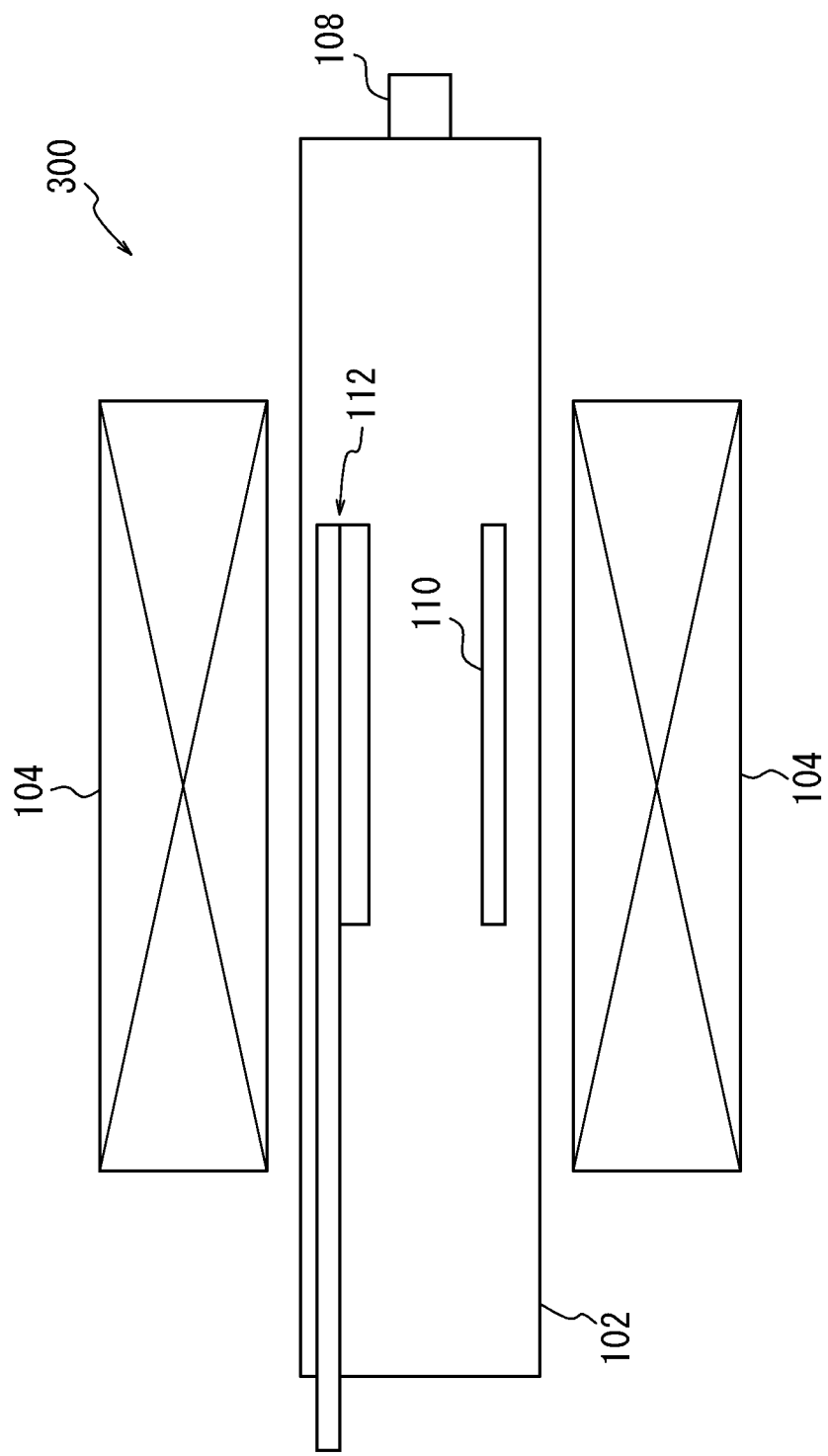
FIG. 3 is a schematic view illustrating an example of configuration of another CNT production apparatus that is applicable to the present disclosure.

FIG. 3 schematically illustrates a CNT production apparatus 300 used in the production method of the present embodiment. The apparatus 300 has the same configuration as the apparatus illustrated in FIG. 1 in all aspects other than that the apparatus 300 uses a shower head 112 to spray the reducing gas, the feedstock gas, the catalyst activating material, and so forth.

The shower head 112 is positioned such that a spraying axis of each spraying nozzle is substantially perpendicular to a catalyst film formation surface of the substrate. In other words, a gas stream sprayed from the spraying nozzles in the shower head is substantially perpendicular to the substrate.

Spraying of the reducing gas using the shower head 112 enables uniform dispersion of the reducing gas onto the substrate and efficient reduction of the catalyst. As a result, homogeneity of an aligned CNT aggregate grown on the substrate can be improved and the amount of the reducing gas that is consumed can be reduced. Spraying of the feedstock gas using a shower head such as described above enables uniform dispersion of the feedstock gas onto the substrate and efficient consumption of the feedstock gas. As a result, homogeneity of an aligned CNT aggregate grown on the substrate can be improved and the amount of the feedstock gas that is consumed can be reduced. Spraying of the catalyst activating material using a shower head such as described above enables uniform dispersion of the catalyst activating material onto the substrate, improvement of catalyst activity, and extension of catalyst life. As a result, growth of aligned CNTs can be performed continuously for a long time.

<Example of Continuous Production Apparatus>

Figure 4:
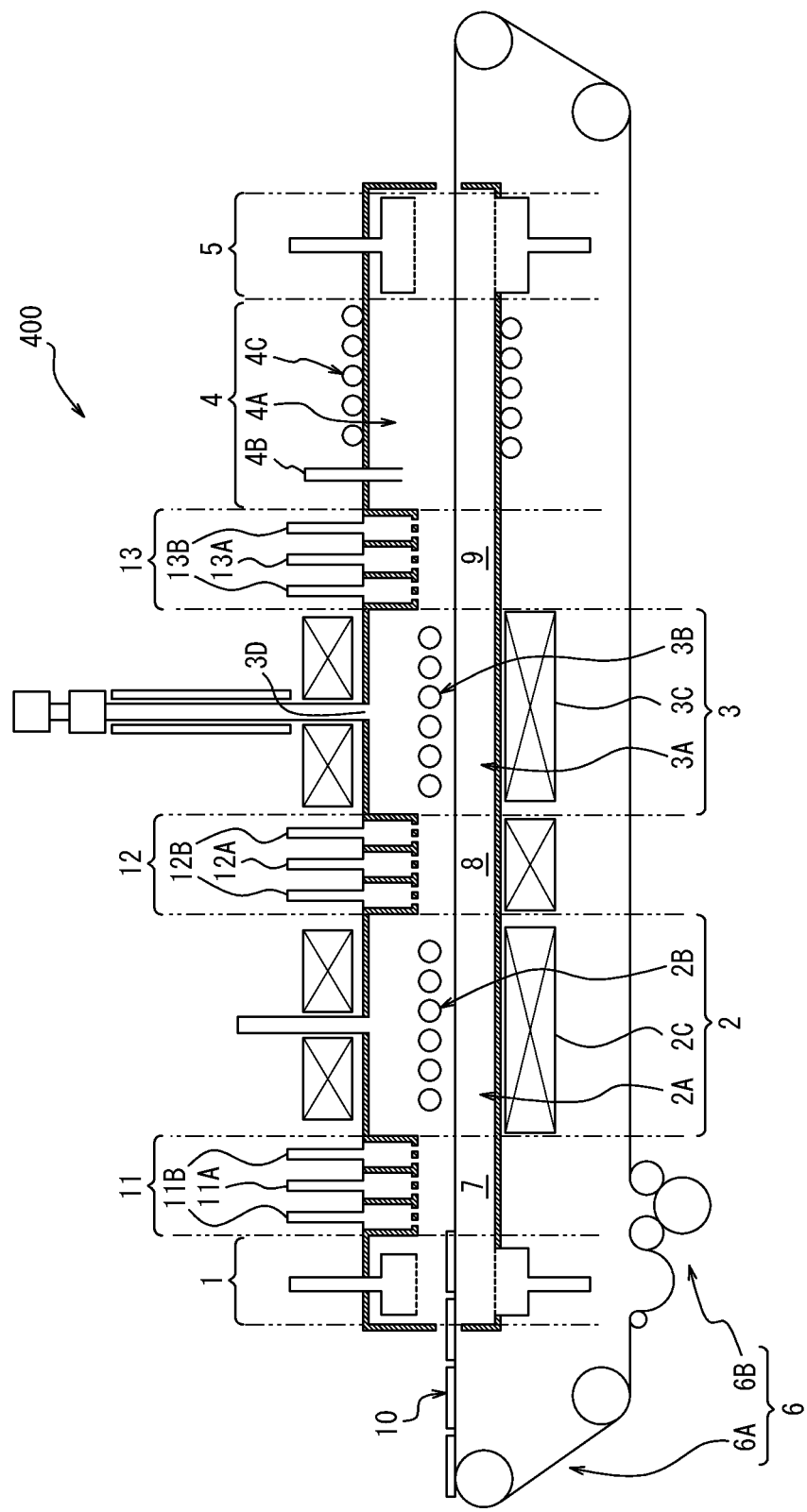
FIG. 4 is a schematic view illustrating an example of configuration of another CNT production apparatus that is applicable to the present disclosure.

FIG. 4 schematically illustrates a CNT production apparatus 400 used in the production method of the present embodiment. As illustrated in FIG. 4, the production apparatus 400 includes an inlet purge section 1, a formation unit 2, a growth unit 3, a cooling unit 4, an outlet purge section 5, a conveyance unit 6, connecting sections 7, 8, and 9, and gas mixing prevention means 11, 12, and 13.

(Inlet Purge Section 1)

The inlet purge section 1 is a set of equipment for preventing external air from entering a furnace through an inlet for a catalyst substrate 10. The inlet purge section 1 has a function of purging an environment around the catalyst 10 conveyed into the production apparatus 400 using an inert purge gas such as nitrogen. Specifically, the inlet purge section 1 for example includes a chamber for holding the purge gas and a spraying section for spraying the purge gas.

(Formation Unit 2)

The formation unit 2 is a set of equipment for implementing the formation step. Specifically, the formation unit 2 for example includes a formation furnace 2A for holding the reducing gas, a reducing gas spraying section 2B for spraying the reducing gas, and a heater 2C for heating either or both of the catalyst and the reducing gas.

(Growth Unit 3)

The growth unit 3 is a set of equipment for implementing the growth step. Specifically, the growth unit 3 includes a growth furnace 3A, a feedstock gas spraying section 3B for spraying the feedstock gas onto the catalyst substrate 10, and a heater 3C for heating either or both of the catalyst and the feedstock gas. An exhaust vent 3D is provided in an upper part of the growth unit 3.

(Cooling Unit 4)

The cooling unit 4 is a set of equipment for implementing the cooling step of cooling the catalyst substrate 10 after an aligned CNT aggregate is grown thereon. Specifically, the cooling unit 4 includes a cooling furnace 4A for holding a cooling gas, a water-cooling pipe 4C around an internal space of the cooling furnace in the case of water-cooling, and a cooling gas spraying section 4B that sprays the cooling gas in the case of air-cooling.

(Outlet Purge Section 5)

The outlet purge section 5 is a set of equipment for preventing external air from entering a furnace through an outlet for the catalyst substrate 10. The outlet purge section 5 has a function of purging an environment around the catalyst substrate 10 using an inert purge gas such as nitrogen. Specifically, the outlet purge section 5 for example includes a chamber for holding the purge gas and a spraying section for spraying the purge gas.

(Conveyance Unit 6)

The conveyance unit 6 is a set of equipment for conveying the catalyst substrate 10 in the furnaces of the production apparatus. Specifically, the conveyance unit 6 for example includes a conveyor belt-type mesh belt 6A and a belt driving section 6B that uses an electric motor equipped with a decelerator.

(Connecting Sections 7, 8, and 9)

The connecting sections 7, 8, and 9 are sets of equipment that spatially connect internal furnace spaces of the units. Specifically, the connecting sections 7, 8, and 9 are for example furnaces or chambers that can block off external air from an environment around the catalyst substrate 10 and that can allow the catalyst substrate 10 to pass between the units.

(Gas Mixing Prevention Means 11, 12, and 13)

The gas mixing prevention means 11, 12, and 13 are sets of equipment provided in the connecting sections 7, 8, and 9 for preventing mixing of gases between adjacent furnaces in the production apparatus 100 (i.e., formation furnace 2A, growth furnace 3A, and cooling furnace 4A). The gas mixing prevention means 11, 12, and 13 respectively include seal gas spraying sections 11B, 12B, and 13B that spray a seal gas such as nitrogen along open planes of inlets and outlets in the furnaces for the catalyst substrate 10 and exhaust sections 11A, 12A, and 13A that mainly vent the sprayed seal gas externally.

The catalyst substrate 10 is placed on the mesh belt 6A, is conveyed into the furnace of the inlet purge section 1 through an apparatus inlet, and, after being processed in each of the furnaces, is conveyed outside of the apparatus from the outlet purge section 5 through an apparatus outlet.

(Carbon Nanostructure)

Although the presently disclosed production method can be used to produce high-quality CNTs with high efficiency as described above, the production method is not limited to CNTs. Various other carbon nanostructures, such as carbon nanocoils and so forth, that can be grown on a catalyst surface by CVD and that include $sp^2$ hybridized carbon can be produced by appropriately adjusting production conditions with reference to commonly known literature. Examples of such commonly known literature include JP2009-127059 (diamond-like carbon), JP2013-86993 (graphene), JP2001-192204 (coils/twists), and JP2003-277029 (fullerenes).

The following explains CNTs obtained through the presently disclosed production method as one example of the carbon nanostructure obtained through the presently disclosed production method. It should be noted that the CNTs are obtained directly from the presently disclosed production method as an aligned CNT aggregate. The aggregate can for example be peeled from the catalyst substrate physically, chemically, or mechanically to obtain bulk state CNTs or powder state CNTs. Specific examples of peeling methods that can be used include peeling by an electric field, a magnetic field, centrifugal force, or surface tension, direct mechanical peeling using tweezers or a cutter blade, and peeling through heating or pressure from, for example, suction by a vacuum pump.

The CNT yield of the presently disclosed production method is preferably at least 2.3 mg/cm$^2$ and more preferably at least 3.0 mg/cm$^2$. The yield is calculated in the present disclosure through the equation shown below.

Yield=(Difference in substrate mass pre- and post-CNT production)/(Catalyst support area of substrate)

In the presently disclosed production method, the carbon conversion efficiency is preferably at least 2.8% and more preferably at least 3.5%. In the present disclosure, the term "carbon conversion efficiency" refers to a value of (mass of produced CNTs)/(total mass of carbon introduced into furnace)×100[%]. Furthermore, the "total mass of carbon introduced into furnace" can be calculated assuming an ideal gas approximation using three values: gas flow, carbon concentration of the feedstock gas, and growth time.

Although the CNTs may be single-walled carbon nanotubes or multi-walled carbon nanotubes, the presently disclosed production method enables more suitable production of single-walled carbon nanotubes.

An average diameter (Av) of the CNTs is preferably at least 0.5 nm and more preferably at least 1 nm, and is preferably no greater than 15 nm and more preferably no greater than 10 nm. The average diameter (Av) of the carbon nanotubes is normally obtained by measuring 100 randomly selected carbon nanotubes using a transmission electron microscope.

The CNTs are obtained through the presently disclosed production method as an aligned CNT aggregate that preferably has a specific surface area of at least 600 m$^2$/g and more preferably at least 800 m$^2$/g, and preferably of no greater than 2,500 m$^2$/g and more preferably no greater than 1,400 m$^2$/g. Furthermore, in a situation in which the CNTs are mainly open CNTs, the specific surface area is preferably at least 1,300 m$^2$/g. The term "specific surface area" is used in the present disclosure to refer to BET specific surface area that is measured by a BET method.

The aligned CNT aggregate preferably has a mass density of at least 0.002 g/cm$^3$ and no greater than 0.2 g/cm$^3$. A mass density of no greater than 0.2 g/cm³ facilitates preparation of a homogenous dispersion when the aligned CNT aggregate is stirred in a solvent or the like because adhesion between CNTs composing the aligned CNT aggregate is weaker. Additionally, a mass density of at least 0.002 g/cm³ improves the unity of the aligned CNT aggregate, thus preventing the CNTs from becoming unbound and making the aligned CNT aggregate easier to handle.

The aligned CNT aggregate preferably has a high degree of alignment. It is possible to evaluate whether or not the aligned CNT aggregate has a high degree of alignment using one or more of methods 1 to 3 described below.

1. When the CNTs are irradiated with X-rays from a first direction parallel to a longitudinal direction of the CNTs and a second direction perpendicular to the first direction, and X-ray diffraction intensity is measured (θ-2θ method), a θ angle and a reflection direction exist for which reflection intensity from the second direction is greater than reflection intensity from the first direction, and a θ angle and a reflection direction exist for which reflection intensity from the first direction is greater than reflection intensity from the second direction.

2. When X-ray diffraction intensity is measured from a two-dimensional diffraction pattern image obtained by irradiating the CNTs with X-rays from a direction perpendicular to the longitudinal direction of the CNTs (Laue method), a diffraction peak pattern indicating the presence of anisotropy appears.

3. A Herman's orientation factor calculated using the X-ray diffraction intensity obtained by the θ-2θ method or the Laue method is greater than 0 and less than 1, and preferably at least 0.25 and no greater than 1.

The aligned CNT aggregate preferably has a height (length) of at least 10 μm and no greater than 10 cm. A height of at least 10 μm improves alignment. Additionally, a height of no greater than 10 cm allows rapid CNT production, thereby suppressing adhesion of carbonaceous impurities and improving specific surface area.

A G/D ratio of the aligned CNT aggregate is preferably at least 2 and more preferably at least 4. The G/D ratio is commonly used as an index for evaluating CNT quality. In a Raman spectrum of CNTs measured by a Raman spectrometer, vibration modes referred to as a G band (near 1600 cm⁻¹) and a D band (near 1350 cm⁻¹) are observed. The G band corresponds to vibration modes caused by a hexagonal lattice structure of graphite forming cylindrical surfaces of the CNTs and the D band corresponds to vibration modes caused by amorphous locations. Therefore, CNTs having a higher ratio of G band and D band peak intensities (G/D ratio) can be evaluated as having higher crystallinity.

The aligned CNT aggregate normally has a purity without purification treatment of at least 98% by mass, and preferably at least 99.9% by mass. The aligned CNT aggregate obtained through the presently disclosed production method hardly has any impurities mixed therein and can sufficiently exhibit the various inherent properties of CNTs. In a situation in which purification treatment is not performed, the carbon purity directly after growth is also the purity of the final product. Purification treatment may be performed as necessary by a commonly known method. The term "purity" is used in the present description to refer to carbon purity, which is the mass ratio of carbon in the synthesized aligned CNT aggregate. The purity can be obtained through atomic analysis using X-ray fluorescence.

(CNTs Having High Metallic CNT Content)

The following explains CNTs that can be suitably produced through the above-described carbon nanostructure production method (4). One feature of CNTs of the present embodiment is that in a Raman spectrum measured by resonance Raman scattering at an excitement wavelength of 532 nm, $$0.6 \leq \left( \sum_{k=1}^{n} I_{BFW}^{k} \right) \Big/ I_{G+} \quad [\text{Math 2}]$$

where $I_{G+}$ represents intensity of a G+ band peak appearing near 1590 cm⁻¹ (specifically, in a range from 1600 cm⁻¹ to 1580 cm⁻¹), $I^k_{BWF}$ represents intensity of a $k^{th}$ G− band peak among n G− band peaks appearing in a range from 1500 cm⁻¹ to 1560 cm⁻¹, and n represents an integer of at least 1.

A G band appearing near 1590 cm⁻¹ is a commonly held feature of spectra of graphitic materials and, in the case of graphite, the aforementioned G band appears near 1585 cm⁻¹. In the case of CNTs, the G band is split into a G+ band and a G− band as a result of curvature of the cylindrical structure eliminating degeneracy. The G+ band normally appears near 1590 cm⁻¹ regardless of CNT diameter, whereas the G− band is dependent on diameter and helicity of the CNTs and thus a plurality of G− bands appear in accordance with the types of CNTs that are included. A G− band for a metallic CNT appears at a lower vibration number (from 1500 cm⁻¹ to 1560 cm⁻¹) than a G− band for a semiconducting CNT and, as a result of favorably matching a Breit-Wigner-Fano (BWF) spectrum fitting function, is often referred to as a BWF peak. Therefore, a value (also referred to below as "peak intensity ratio R") obtained by dividing the total peak intensity of intensities $I^1_{BWF}$, $I^2_{BWF}$, ..., $I^n_{BWF}$ of n G− band peaks detected in a range from 1500 cm⁻¹ to 1560 cm⁻¹ by intensity $I_{G+}$ of the G+ band peak is used as an index that correlates with the metallic CNT content of the produced CNTs.

In a Raman spectrum of CNTs produced by a conventional CVD method, a G− band peak caused by metallic CNTs is either not detected in the range from 1500 cm⁻¹ to 1560 cm⁻¹ or is detected with a weak intensity. In contrast, the CNTs of the present embodiment have a high metallic CNT content that is not conventionally seen and, as a result, a G− band peak is clearly detected in the range from 1500 cm⁻¹ to 1560 cm⁻¹. In addition, the peak intensity ratio R has a high value of at least 0.6 which is not conventionally seen.

The CNTs of the present embodiment preferably have a peak intensity ratio R of at least 0.8. Although no specific limitations are placed on an upper limit for the peak intensity ratio R, the upper limit can normally be set as 1.0.

Spectral features observed in a low-wavenumber region from 100 cm⁻¹ to 350 cm⁻¹ are modes caused by vibration in CNT diameter referred to as radial breathing modes (RBMs). The wavenumber of an RBM peak is inversely proportional to CNT diameter (248/dt [cm⁻¹], where dt [nm] is the nanotube diameter) and thus the wavenumber can be used to evaluate CNT diameter. In a Raman spectrum of the CNTs of the present embodiment measured at an excitation wavelength of 532 nm, a largest peak among RBM peaks appearing in a range from 100 cm⁻¹ to 350 cm⁻¹ preferably appears in a range from 200 cm⁻¹ to 270 cm⁻¹. A RBM peak appearing in the range from 200 cm⁻¹ to 270 cm⁻¹ is caused by a narrow single-walled CNT having a diameter of approximately 0.92 nm to 1.24 nm and can be determined to be caused by a metallic CNT from correspondence to a Kataura plot (H. Kataura, Y. Kumazawa, Y. Maniwa, I. Umezu, S. Suzuki, Y. Ohtsuka and Y. Achiba; Optical Properties of Single-Wall Carbon Nanotubes; Synth. Met. 103 (1999); pp. 2555-2558). In other words, appearance of the largest RBM peak in the range from 200 $cm^{-1}$ to 270 $cm^{-1}$ in the Raman spectrum measured at the excitation wavelength of 532 nm signifies that the CNTs of the present embodiment include a large number of metallic CNTs having a diameter of approximately 1 nm.

The CNTs of the present embodiment have high metallic CNT content as described above, and also have high purity and high specific surface area. More specifically, firstly, a specific surface area of from 600 $m^2/g$ to 2,500 $m^2/g$ and preferably from 800 $m^2/g$ to 1.400 $m^2/g$ can be achieved. Secondly, the present embodiment can achieve a purity of at least 98% and preferably at least 99% according to X-ray fluorescence measurement.

Figure 12:
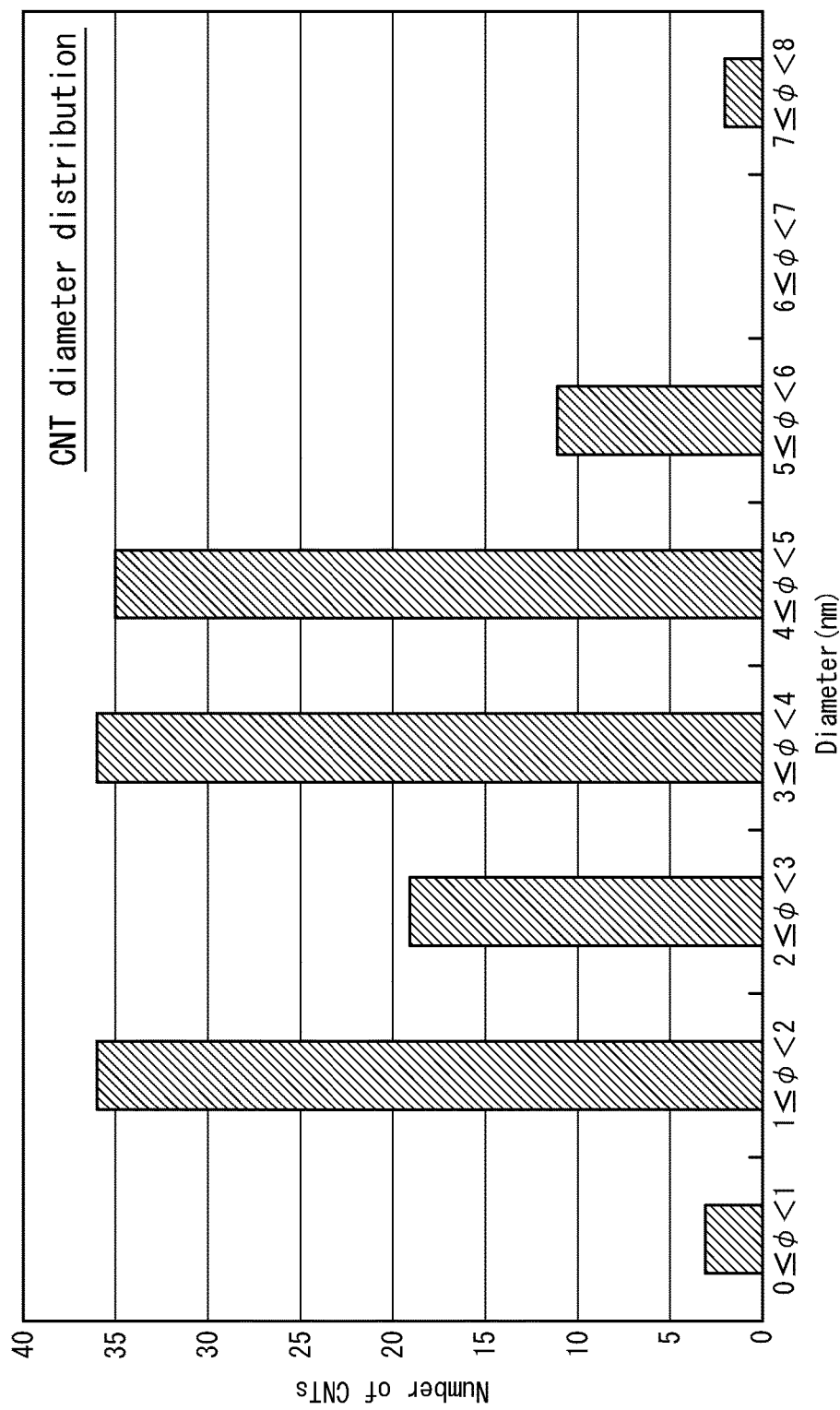
FIG. 12 is a graph illustrating a diameter distribution of CNTs of Example 11-4.

The CNTs of the present embodiment preferably have a central diameter size of from 1 nm to 5 nm, and more preferably from 1.5 nm to 4 nm. A central diameter size of at least 1 nm can reduce bundling of the CNTs and can maintain a high specific surface area. A central diameter size of no greater than 5 nm can reduce the ratio of multi-walled CNTs and can maintain a high specific surface area. In the present disclosure, the central diameter size of the CNTs is obtained as follows. First, a histogram is prepared by measuring the diameters of at least 100 random CNTs using a transmission electron microscope. FIG. 12 illustrates an example of a histogram (CNT diameter distribution) prepared as described above. A central value of a diameter range having a largest value in the histogram for the number of CNTs is taken to be the "central diameter size." In the example illustrated in FIG. 12, there are two central diameter sizes at approximately 1.5 nm and approximately 3.5 nm.

EXAMPLES

The following provides a more specific explanation through examples; however, the present disclosure is not limited to the following examples.

(Substrate)

A flat plate of Fe—Cr alloy SUS430 (produced by JFE Steel Corporation, 18% by mass Cr) was prepared with a height of 500 mm, a width of 500 mm, and a thickness of 0.6 mm. The flat plate had an arithmetic average roughness Ra of approximately 0.063 µm for surface roughness measured at a plurality of locations using a laser microscope.

(Catalyst Formation)

A catalyst was formed on the above-described substrate by the following method. First, a coating agent for alumina film formation was prepared by dissolving 1.9 g of aluminum tri-sec-butoxide in 100 mL (78 g) of 2-propanol, and by adding and dissolving 0.9 g of triisopropanolamine as a stabilizer. The above-described coating agent for alumina film formation was applied onto the substrate by dip coating under ambient conditions of a room temperature of 25° C. and a relative humidity of 50%. A holding time after substrate immersion of 20 seconds, a pulling up speed of 10 mm/s, and an air drying time after substrate pulling up of 5 minutes were adopted as application conditions. Next, heating was performed for 30 minutes in an air environment at 300° C. and subsequently cooling was performed to room temperature. As a result, an alumina film having a film-thickness of 40 nm was formed on the substrate.

Next, an iron film coating agent was prepared by dissolving 174 mg of iron acetate in 100 mL of 2-propanol, and by adding and dissolving 190 mg of triisopropanolamine as a stabilizer. The above-described iron film coating agent was applied onto the substrate with the alumina film formed thereon by dip coating at ambient conditions of a room temperature of 25° C. and a relative humidity of 50%. A holding time after substrate immersion of 20 seconds, a pulling up speed of 3 mm/s, and an air drying time after substrate pulling up of 5 minutes were adopted as application conditions. Next, heating was performed for 30 minutes in an air environment at 100° C. and subsequently cooling was performed to room temperature. As a result, a catalyst production film having a film-thickness of 3 nm was formed.

In all of the following experimental examples, a substrate having a catalyst formed thereon as described above was used.

Experimental Example 1

CNTs were produced by carrying out a formation step and a growth step in order in a batch growth furnace such as illustrated in FIG. 1. The CNTs were produced on a substrate surface by carrying out the formation step and the growth step in order using a catalyst substrate of 40 mm in height and 40 mm in width cut from the above-described catalyst substrate. Table 1 shows the gas flow, gas composition, heater temperature setting, and processing time of each of the steps.

TABLE 1

| Step | Gas flow [sccm] | Feedstock gas composition [vol %] | | | | Carbon concentration [%] | Temperature [° C.] | Processing time [min] |
| --- | --- | --- | --- | --- | --- | --- | --- | --- |
| | | $C_2H_4$ | $H_2O$ | $H_2$ | $N_2$ | | | |
| Formation | 3000 | — | — | 100 | — | — | 750 | 23 |
| Growth | 2000 | 10 | 0.0250 | — | Remainder | 20 | 800 | 10 |

The heating time of the feedstock gas was adjusted by changing the installation position of the catalyst substrate in order to determine a substrate position giving a most favorable balance of yield and specific surface area for produced CNTs. A growth step was initially carried out without installing a catalyst substrate and gas that was suction sampled at approximately 200 sccm near the substrate installation position was analyzed. Table 2 shows the analysis results. The term "feedstock gas heating time" refers to an approximate average time that it takes the feedstock gas to reach the catalyst substrate after entering a heating region inside the furnace and is obtained through the equation shown below.

Feedstock gas heating time [min]=(Volume of heating region upstream of substrate [mL])/{(Gas flow [sccm])×(Furnace temperature [K])×1/(273 [K])}

TABLE 2

| Step | Contacting gas composition [vol %] | | | | | | [A]/[B] |
|---|---|---|---|---|---|---|---|
| | CPD | $C_2H_2$ | $pC_3H_4$ | VA | $aC_3H_4$ | $H_2O$ | |
| Growth | 0.0545 | 0.2153 | 0.0137 | 0.0167 | 0.0054 | 0.0221 | 0.22 |

In Table 2, CPD represents cyclopentadiene, $pC_3H_4$ represents methylacetylene (propyne), VA represents vinylacetylene, and $aC_3H_4$ represents propadiene (allene). The same applies to tables shown below. Besides the components shown in Table 2, trace amounts (no greater than 10 ppm) were detected of acetylene compounds in the form of 1-butyne, diacetylene, and phenylacetylene, a cyclopentadiene compound in the form of methylcyclopentadiene, and an allene compound in the form of 1,2-butadiene. Other detected components included hydrogen, methane, ethylene, ethane, propylene, 1,3-butadiene, t-1,3-pentadiene, benzene, toluene, styrene, indene, and naphthalene. In the present experimental example, the total volume concentration [A] of the hydrocarbon A was less than 0.06% and the feedstock gas was composed of only ethylene; therefore, the present experimental example is referred to as "Comparative Example 1."

The properties of CNTs produced under the above-described conditions were evaluated. Table 3 shows the results.

TABLE 3

| | Yield [mg/cm$^2$] | Specific surface area [m$^2$/g] | G/D | Carbon conversion efficiency [%] |
|---|---|---|---|---|
| Comparative Example 1 | 2.0 | 1056 | 4.7 | 1.5 |

FIG. 7(A) illustrates a Raman spectrum (RMP-330 produced by JASCO Corporation, 532 nm excitation wavelength) of the CNTs produced under the above-described conditions. The spectrum was normalized by setting the intensity of the G+ band as 1. Positions of peaks in the Raman spectrum were detected by deconvolution analysis. FIG. 7(B) illustrates the spectrum after deconvolution analysis. Table 4 shows wavenumbers and intensities of peaks, specific surface area, purity according to X-ray fluorescence measurement, and central diameter size.

TABLE 4

| | | Raman spectrum | | | | Largest RBM peak | Specific surface area [m$^2$/g] | Purity [%] | Central diameter size [nm] |
|---|---|---|---|---|---|---|---|---|---|
| | | G+ | G−  Semiconducting | Metallic | D | | | | |
| Comparative Example 1 | Wavenumber | 1597 | 1576 | — | 1335 | 169 | 1056 | 99 | 3.5 |
| | Intensity | 1 | 0.52 | — | 0.2 | 0.33 | | | |

In the present Comparative Example 1, a G− band peak due to metallic CNTs could not be detected. Furthermore, the largest RBM peak appeared at a wavenumber of 169 cm$^{-1}$, outside of the range from 200 cm$^{-1}$ to 270 cm$^{-1}$.

Experimental Example 2

CNTs were produced using the same production apparatus as in Experimental Example 1, but the composition of the feedstock gas in the growth step was changed as shown in Table 5. Conditions not shown in Table 5 were the same as in Experimental Example 1.

TABLE 5

| | Gas flow [sccm] | Feedstock gas composition [vol %] | | | | | Carbon concentration [vol %] | Temperature [° C.] |
|---|---|---|---|---|---|---|---|---|
| | | Hydrocarbon A' CPE | Hydrocarbon B' $C_2H_2$ | $H_2$ | $H_2O$ | $N_2$ | | |
| Example 2-1 | 5000 | 0.40 | 0.50 | 0.60 | 0.0100 | Remainder | 3.0 | 760 |
| Example 2-2 | | 0.80 | 1.00 | 1.20 | 0.0200 | | 6.0 | |
| Example 2-3 | | 1.20 | 1.50 | 1.80 | 0.0300 | | 9.0 | |
| Example 2-4 | | 1.60 | 2.00 | 2.40 | 0.0400 | | 12.0 | |

In Table 5, CPE represents cyclopentene. The same applies to tables shown below. An experiment was conducted for each set of conditions by changing the carbon concentration (concentration of carbon atoms in the feedstock gas) while keeping the concentration ratio ([A']/[B']) of CPE and $C_2H_2$ in the feedstock gas fixed (0.8). Furthermore, the concentrations of hydrogen, $H_2$, and the catalyst activating material, $H_2O$, added to the feedstock gas were changed in proportion to the carbon concentration in each set of conditions.

The feedstock gas heating time was adjusted by changing the installation position of the catalyst substrate. A growth step was initially carried out without installing a catalyst substrate and gas that was suction sampled at approximately 200 sccm near the substrate installation position was analyzed. Table 6 shows the analysis results.

TABLE 6

| | Contacting gas composition [vol %] | | | | | | |
|---|---|---|---|---|---|---|---|
| | Hydrocarbon A | Hydrocarbon B | | | Hydrocarbon C | | |
| | CPD | $C_2H_2$ | $pC_3H_4$ | VA | $aC_3H_4$ | $H_2O$ | [A]/[B] |
| Example 2-1 | 0.3034 | 0.5224 | 0.0004 | 0.0005 | 0.0005 | 0.0123 | 0.58 |
| Example 2-2 | 0.6669 | 1.0225 | 0.0010 | 0.0016 | 0.0007 | 0.0211 | 0.65 |
| Example 2-3 | 0.8334 | 1.4837 | 0.0013 | 0.0016 | 0.0007 | 0.0238 | 0.56 |
| Example 2-4 | 1.2049 | 1.9510 | 0.0020 | 0.0025 | 0.0008 | 0.0317 | 0.62 |

Besides the components shown in Table 6, trace amounts (no greater than several ppm) were detected of an acetylene compound in the form of phenylacetylene, a cyclopentadiene compound in the form of methylcyclopentadiene, and an allene compound in the form of 1,2-butadiene. Other detected components included hydrogen, methane, ethylene, propylene, acetone, cyclopentene, cyclopentane, and toluene.

Figure 5:
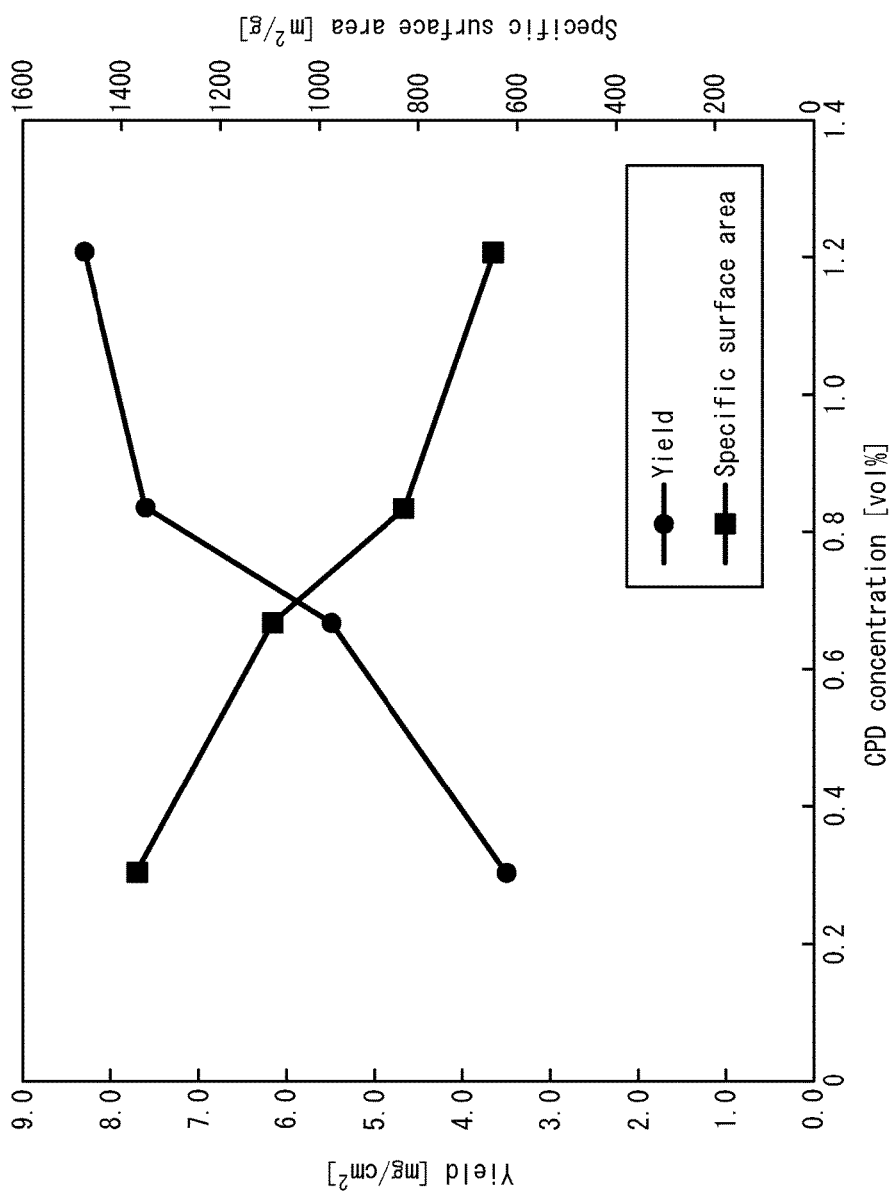
FIG. 5 is a graph illustrating a relationship between cyclopentadiene (CPD) concentration and carbon nanotube yield and a relationship between CPD concentration and carbon nanotube specific surface area in Experimental Example 2.

The properties of CNTs produced under each set of conditions were evaluated. Table 7 and FIG. 5 show the results.

TABLE 7

| | Yield [mg/cm$^2$] | Specific surface area [m$^2$/g] | G/D | Carbon conversion efficiency [%] |
|---|---|---|---|---|
| Example 2-1 | 3.5 | 1371 | 5.3 | 7.0 |
| Example 2-2 | 5.5 | 1096 | 5.1 | 5.5 |
| Example 2-3 | 7.6 | 833 | 4.2 | 5.0 |
| Example 2-4 | 8.3 | 650 | 3.9 | 4.1 |

It was demonstrated that in Examples 2-1 to 2-4 for which CPD concentration was at least 0.2%, the yield was increased by a factor of approximately 2 to 5 compared to Comparative Example 1 while maintaining a specific surface area of at least 600 m$^2$/g. It was also demonstrated that the carbon conversion efficiency was improved by a factor of approximately 3 to 5 compared to Comparative Example 1.

Experimental Example 3

CNTs were produced using the same production apparatus as in Experimental Example 1, but the composition of the feedstock gas in the growth step was changed as shown in Table 8. Conditions not shown in Table 8 were the same as in Experimental Example 2.

TABLE 8

| | Gas flow [sccm] | Feedstock gas composition [vol %] | | | | | |
|---|---|---|---|---|---|---|---|
| | | Hydrocarbon A' CPE | Hydrocarbon B' $C_2H_2$ | $H_2$ | $H_2O$ | $N_2$ | [A']/[B'] |
| Comparative Example 3-1 | 5000 | 0.00 | 3.00 | 2.00 | 0.0200 | Remainder | 0.00 |
| Example 3-1 | | 0.40 | 2.00 | 1.60 | | | 0.20 |

TABLE 8-continued

| | Gas flow [sccm] | Feedstock gas composition [vol %] | | | | | |
|---|---|---|---|---|---|---|---|
| | | Hydrocarbon A' CPE | Hydrocarbon B' $C_2H_2$ | $H_2$ | $H_2O$ | $N_2$ | [A']/[B'] |
| Example 3-2 | | 0.60 | 1.50 | 1.40 | | | 0.40 |
| Example 3-3 | | 0.72 | 1.20 | 1.28 | | | 0.60 |
| Example 2-2 | | 0.80 | 1.00 | 1.20 | | | 0.80 |
| Example 3-4 | | 0.94 | 0.65 | 1.06 | | | 1.45 |
| Example 3-5 | | 1.00 | 0.50 | 1.00 | | | 2.00 |
| Example 3-6 | | 1.09 | 0.28 | 0.91 | | | 3.89 |
| Example 3-7 | | 1.15 | 0.12 | 0.85 | | | 9.58 |
| Example 3-8 | | 1.18 | 0.05 | 0.82 | | | 23.60 |
| Example 3-9 | | 1.19 | 0.01 | 0.81 | | | 119.00 |

CNTs were produced for each set of conditions by changing the concentration ratio ([A']/[B']) of CPE and $C_2H_2$ in the feedstock gas as shown in Table 8 while keeping the carbon concentration fixed (6.0%). Furthermore, in each set of conditions, the concentration of hydrogen, $H_2$, added to the feedstock gas was changed such that a total concentration including hydrogen produced by CPE thermal decomposition was 2% and the concentration of the catalyst activating material, $H_2O$, added to the feedstock gas was kept fixed at 0.0200%.

The installation position of the catalyst substrate was the same as in Experimental Example 2. A growth step was initially carried out without installing a catalyst substrate and gas that was suction sampled at approximately 200 sccm near the substrate installation position was analyzed. Table 9 shows the analysis results.

TABLE 9

| | Contacting gas composition [vol %] | | | | | | |
|---|---|---|---|---|---|---|---|
| | Hydrocarbon A | Hydrocarbon B | | Hydrocarbon C | | | |
| | CPD | $C_2H_2$ | $pC_3H_4$ | VA | $aC_3H_4$ | $H_2O$ | [A]/[B] |
| Comparative Example 3-1 | 0.0025 | 2.7087 | 0.0044 | 0.0581 | 0.0006 | 0.0203 | 0.001 |
| Example 3-1 | 0.3578 | 2.0686 | 0.0022 | 0.0087 | 0.0005 | 0.0238 | 0.17 |
| Example 3-2 | 0.5429 | 1.5432 | 0.0015 | 0.0040 | 0.0006 | 0.0235 | 0.35 |
| Example 3-3 | 0.6513 | 1.2245 | 0.0012 | 0.0023 | 0.0006 | 0.0241 | 0.53 |
| Example 2-2 | 0.6669 | 1.0225 | 0.0010 | 0.0016 | 0.0007 | 0.0212 | 0.65 |
| Example 3-4 | 0.9079 | 0.6908 | 0.0009 | 0.0008 | 0.0008 | 0.0212 | 1.31 |
| Example 3-5 | 0.9069 | 0.5095 | 0.0007 | 0.0005 | 0.0008 | 0.0206 | 1.78 |
| Example 3-6 | 1.0234 | 0.2827 | 0.0005 | 0.0002 | 0.0009 | 0.0225 | 3.61 |
| Example 3-7 | 1.0100 | 0.1205 | 0.0004 | 0.0002 | 0.0010 | 0.0221 | 8.34 |
| Example 3-8 | 1.0880 | 0.0612 | 0.0005 | 0.0002 | 0.0011 | 0.0222 | 17.58 |
| Example 3-9 | 1.1593 | 0.0184 | 0.0007 | 0.0003 | 0.0014 | 0.0183 | 59.76 |

Besides the components shown in Table 9, trace amounts (no greater than several ppm) were detected of an acetylene compound in the form of phenylacetylene, a cyclopentadiene compound in the form of methylcyclopentadiene, and an allene compound in the form of 1,2-butadiene. Other detected components included hydrogen, methane, ethylene, propylene, acetone, cyclopentene, and cyclopentane.

Figure 6:
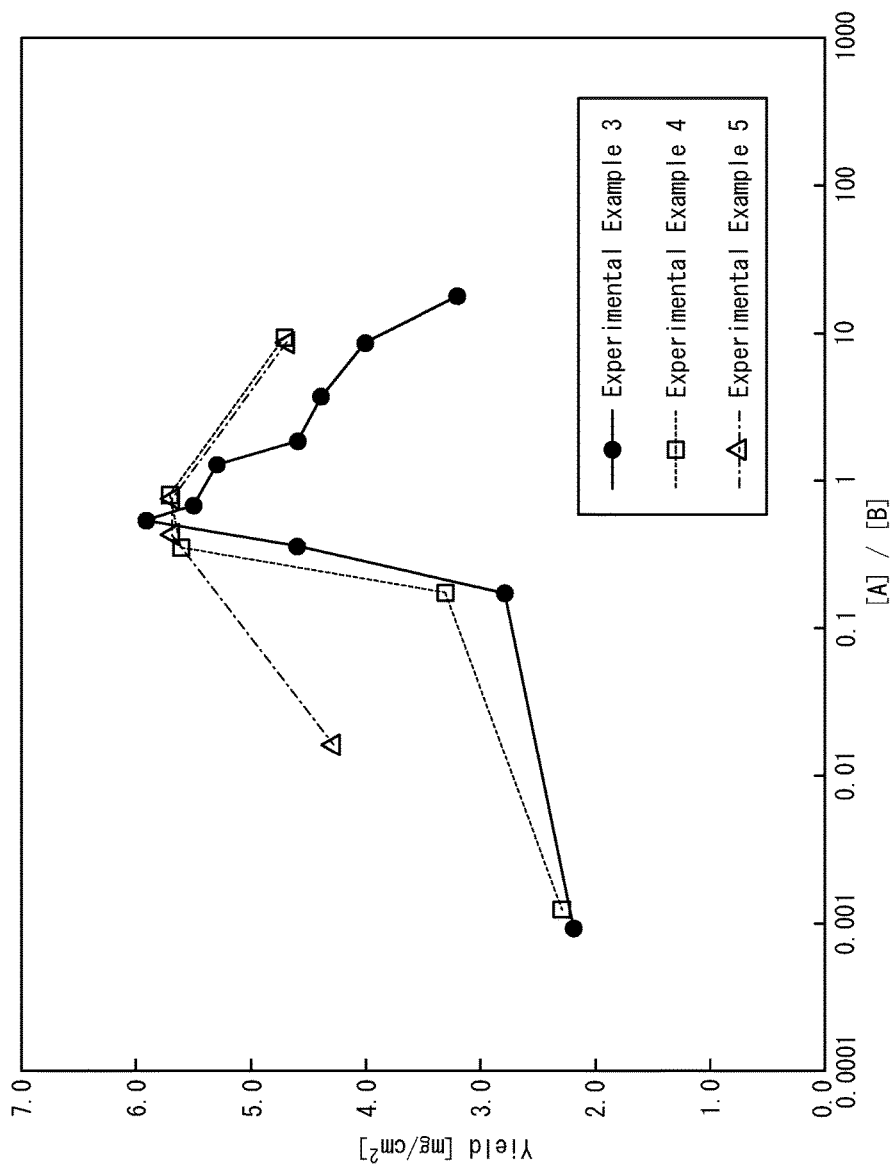
FIG. 6 is a graph illustrating a relationship between volume concentration ratio [A]/[B] of hydrocarbons A and B and carbon nanotube yield in each of Experimental Examples 3 to 5.

The properties of CNTs produced under each set of conditions were evaluated. Table 10 and FIG. 6 show the results.

TABLE 10

| | Yield [mg/cm²] | Specific surface area [m²/g] | G/D | Carbon conversion efficiency [%] |
|---|---|---|---|---|
| Comparative Example 3-1 | 2.2 | 898 | 2.6 | 2.2 |
| Example 3-1 | 2.8 | 822 | 2.6 | 2.8 |
| Example 3-2 | 4.6 | 925 | 3.9 | 4.6 |
| Example 3-3 | 5.9 | 1068 | 4.2 | 5.9 |
| Example 2-2 | 5.5 | 1096 | 5.1 | 5.5 |
| Example 3-4 | 5.3 | 1087 | 4.8 | 5.3 |
| Example 3-5 | 4.6 | 976 | 4.8 | 4.6 |
| Example 3-6 | 4.4 | 886 | 5.6 | 4.4 |
| Example 3-7 | 4.0 | 826 | 5.3 | 4.0 |

TABLE 10-continued

| | Yield [mg/cm²] | Specific surface area [m²/g] | G/D | Carbon conversion efficiency [%] |
|---|---|---|---|---|
| Example 3-8 | 3.2 | 844 | 5.2 | 3.2 |
| Example 3-9 | 4.2 | 663 | 4.0 | 4.2 |

It was demonstrated that in the examples for which [A] was at least 0.2% and [B] was at least 0.01%, the yield could be increased by a factor of 1.3 to 2.7 compared to Comparative Example 1 in which [A] was outside the presently disclosed range, while maintaining a specific surface area of at least 600 m²/g. It was also demonstrated that the carbon conversion efficiency was improved by a factor of approximately 1.3 to 2.7. Furthermore, the above tendency was particularly noticeable for [A]/[B] in a range from 0.2 to 100.

Experimental Example 4

CNTs were produced using the same production apparatus as in Experimental Example 1, but the composition of the feedstock gas in the growth step was changed as shown in Table 11 such that methylacetylene was used as an acetylene compound (hydrocarbon B'). Conditions not shown in Table 11 were the same as in Experimental Example 3.

TABLE 11

| | | Feedstock gas composition [vol %] | | | | | |
|---|---|---|---|---|---|---|---|
| | Gas flow [sccm] | Hydrocarbon A' CPE | Hydrocarbon B' pC$_3$H$_4$ | H$_2$ | H$_2$O | N$_2$ | [A']/[B'] |
| Comparative Example 4-1 | 5000 | 0.00 | 2.00 | 2.00 | 0.0200 | Remainder | 0.00 |
| Example 4-1 | | 0.36 | 1.40 | 1.64 | | | 0.26 |
| Example 4-2 | | 0.49 | 1.18 | 1.51 | | | 0.42 |
| Example 4-3 | | 0.69 | 0.85 | 1.31 | | | 0.81 |
| Example 4-4 | | 1.12 | 0.13 | 0.88 | | | 8.62 |

CNTs were produced for each set of conditions by changing the concentration ratio ([A']/[B']) of CPE and methylacetylene in the feedstock gas as shown in Table 11 while keeping the carbon concentration fixed (6.0%). Furthermore, in each set of conditions, the concentration of hydrogen, H$_2$, added to the feedstock gas was changed such that a total concentration including hydrogen produced by CPE thermal decomposition was 2% and the concentration of the catalyst activating material, H$_2$O, added to the feedstock gas was kept fixed at 0.0200%.

The installation position of the catalyst substrate was the same as in Experimental Example 2. A growth step was initially carried out without installing a catalyst substrate and gas that was suction sampled at approximately 200 sccm near the substrate installation position was analyzed. Table 12 shows the analysis results.

Besides the components shown in Table 12, trace amounts (no greater than 10 ppm) were detected of acetylene compounds in the form of 1-butyne, diacetylene, and phenylacetylene and a cyclopentadiene compound in the form of methylcyclopentadiene. An allene compound in the form of 1,2-butadiene was detected at approximately a few ppm to 10 ppm. Other detected components included hydrogen, methane, ethylene, propylene, cyclopentene, and cyclopentane.

The properties of CNTs produced under each set of conditions were evaluated. Table 13 and FIG. 6 show the results.

TABLE 13

| | Yield [mg/cm²] | Specific surface area [m²/g] | G/D | Carbon conversion efficiency [%] |
|---|---|---|---|---|
| Comparative Example 4-1 | 2.3 | 559 | 1.6 | 2.3 |
| Example 4-1 | 3.3 | 749 | 3.8 | 3.3 |
| Example 4-2 | 5.6 | 1053 | 4.5 | 5.6 |
| Example 4-3 | 5.7 | 973 | 3.8 | 5.7 |
| Example 4-4 | 4.7 | 921 | 4.4 | 4.7 |

The same results as in Experimental Example 3 were achieved even though the hydrocarbon B' in the feedstock gas was changed to methylacetylene.

The CNT yields of Experimental Example 3 (example in which the hydrocarbon B' is acetylene) and Experimental Example 4 (example in which the hydrocarbon B' is methylacetylene) are compared in FIG. 6. Although Experimental

TABLE 12

| | Contacting gas composition [vol %] | | | | | | |
|---|---|---|---|---|---|---|---|
| | Hydrocarbon A | Hydrocarbon B | | | Hydrocarbon C | | |
| | CPD | C$_2$H$_2$ | pC$_3$H$_4$ | VA | aC$_3$H$_4$ | H$_2$O | [A]/[B] |
| Comparative Example 4-1 | 0.0024 | 0.0734 | 1.8632 | 0.0005 | 0.1657 | 0.0259 | 0.001 |
| Example 4-1 | 0.2437 | 0.0538 | 1.3138 | 0.0004 | 0.1114 | 0.0257 | 0.18 |
| Example 4-2 | 0.4205 | 0.0315 | 1.1712 | 0.0002 | 0.0672 | 0.0271 | 0.35 |
| Example 4-3 | 0.6602 | 0.0248 | 0.8148 | 0.0002 | 0.0475 | 0.0256 | 0.79 |
| Example 4-4 | 1.0546 | 0.0052 | 0.1096 | 0.0002 | 0.0074 | 0.0226 | 9.17 |

Examples 3 and 4 are similar in terms that the yield increased in a range for which $0.2 \leq [A]/[B] \leq 100$, a peak shape representing the change in yield was more gradual for Experimental Example 4 than Experimental Example 3. It was therefore demonstrated that the trend of increasing yield in accordance with [A]/[B] was more robust in Experimental Example 4. The gas analysis clarifies that a portion of the methylacetylene included in the feedstock gas in Experimental Example 4 was thermally converted and came into contact with the catalyst as an isomer in the form of propadiene ($aC_3H_4$). Thus, it was demonstrated that robustness of production conditions was improved as a result of a gas including propadiene, which is one example of an allene compound, coming into contact with the catalyst.

Experimental Example 5

CNTs were produced using the same production apparatus as in Experimental Example 1, but the composition of the feedstock gas in the growth step was changed as shown in Table 14 such that vinylacetylene was used as an acetylene compound (hydrocarbon B'). Conditions not shown in Table 14 were the same as in Experimental Example 3.

TABLE 14

| | Gas flow [sccm] | Feedstock gas composition [vol %] | | | | | |
|---|---|---|---|---|---|---|---|
| | | Hydrocarbon A' CPE | Hydrocarbon B' VA | $H_2$ | $H_2O$ | $N_2$ | [A']/[B'] |
| Comparative Example 5-1 | 5000 | 0.00 | 1.50 | 2.00 | 0.0200 | Remainder | 0.00 |
| Example 5-1 | | 0.31 | 1.12 | 1.69 | | | 0.28 |
| Example 5-2 | | 0.47 | 0.91 | 1.53 | | | 0.52 |
| Example 5-3 | | 1.04 | 0.20 | 0.96 | | | 5.20 |

CNTs were produced for each set of conditions by changing the concentration ratio ([A']/[B']) of CPE and vinylacetylene in the feedstock gas as shown in Table 14 while keeping the carbon concentration fixed (6.0%). Furthermore, in each set of conditions, the concentration of hydrogen, $H_2$, added to the feedstock gas was changed such that a total concentration including hydrogen produced by CPE thermal decomposition was 2% and the concentration of the catalyst activating material, $H_2O$, added to the feedstock gas was kept fixed at 0.0200%.

The installation position of the catalyst substrate was the same as in Experimental Example 2. A growth step was initially carried out without installing a catalyst substrate and gas that was suction sampled at approximately 200 sccm near the substrate installation position was analyzed. Table 15 shows the analysis results.

Besides the components shown in Table 15, tens of ppm were detected of acetylene compounds in the form of 1-butyne, diacetylene, methylvinylacetylene, and phenylacetylene, and a trace amount (no greater than several ppm) was detected of a cyclopentadiene compound in the form of methylcyclopentadiene. An allene compound was detected in the form of 1,2-butadiene at approximately a few ppm to 10 ppm. Other detected components included hydrogen, methane, ethylene, cyclopentene, cyclopentane, benzene, toluene, styrene, and indene.

The properties of CNTs produced under each set of conditions were evaluated. Table 16 and FIG. 6 show the results.

TABLE 16

| | Yield [mg/cm²] | Specific surface area [m²/g] | G/D | Carbon conversion efficiency [%] |
|---|---|---|---|---|
| Comparative Example 5-1 | 4.3 | 904 | 3.6 | 4.3 |
| Example 5-1 | 5.7 | 910 | 3.5 | 5.7 |

TABLE 16-continued

| | Yield [mg/cm²] | Specific surface area [m²/g] | G/D | Carbon conversion efficiency [%] |
|---|---|---|---|---|
| Example 5-2 | 5.7 | 847 | 3.4 | 5.7 |
| Example 5-3 | 4.7 | 931 | 4.9 | 4.7 |

The same results as in Experimental Example 3 were achieved even though the hydrocarbon B' in the feedstock gas was changed to vinylacetylene.

The CNT yields of Experimental Example 3 (example in which the hydrocarbon B' is acetylene) and Experimental Example 5 (example in which the hydrocarbon B' is vinylacetylene) are compared in FIG. 6. Although Experimental Examples 3 and 5 were similar in terms that the yield

TABLE 15

| | Contacting gas composition [vol %] | | | | | | |
|---|---|---|---|---|---|---|---|
| | Hydrocarbon A | Hydrocarbon B | | | Hydrocarbon C | | |
| | CPD | $C_2H_2$ | $pC_3H_4$ | VA | $aC_3H_4$ | $H_2O$ | [A]/[B] |
| Comparative Example 5-1 | 0.0081 | 0.0812 | 0.0039 | 0.4180 | 0.0015 | 0.0324 | 0.02 |
| Example 5-1 | 0.2584 | 0.0344 | 0.0020 | 0.5798 | 0.0010 | 0.0221 | 0.42 |
| Example 5-2 | 0.3892 | 0.0246 | 0.0014 | 0.5035 | 0.0009 | 0.0235 | 0.74 |
| Example 5-3 | 0.9340 | 0.0051 | 0.0005 | 0.1070 | 0.0009 | 0.0160 | 8.29 | increased in a range for which 0.2≤[A]/[B]≤100, a peak shape representing the change in yield was more gradual for Experimental Example 5 than Experimental Example 3. It was therefore demonstrated that the trend of increasing yield in accordance with [A]/[B] was more robust in Experimental Example 5. The reason for the above is thought to be because vinylacetylene has both the properties of an acetylene compound and the properties of an allene compound due to each vinylacetylene molecule including both a carbon-carbon double bond and a carbon-carbon triple bond.

Experimental Example 6

CNTs were produced by carrying out a formation step and a growth step in order in a batch growth furnace such as illustrated in FIG. 3. The CNTs were produced on a substrate surface by carrying out the formation step and the growth step in order using a catalyst substrate of 40 mm in height and 120 mm in width cut from the above-described catalyst substrate. Table 17 shows the gas flow, gas composition, heater temperature setting, and processing time of each of the steps.

TABLE 17

| Step | Gas flow [sccm] | Feedstock gas composition [vol %] | | | | | Temperature [° C.] | Processing time [min] |
|---|---|---|---|---|---|---|---|---|
| | | Hydrocarbon A' CPE | Hydrocarbon B' $C_2H_2$ | $H_2O$ | $H_2$ | $N_2$ | | |
| Formation | 3000 | — | — | — | 100 | — | 750 | 23 |
| Growth | 2000 | 0.8 | 1.0 | 0.0200 | 1.2 | Remainder | 760 | 10 |

The heating time of the feedstock gas was adjusted by changing the installation position of the catalyst substrate. A growth step was initially carried out without installing a catalyst substrate and gas that was suction sampled at approximately 200 sccm near the substrate installation position was analyzed. Table 18 shows the analysis results.

TABLE 18

| | Contacting gas composition [vol %] | | | | | | |
|---|---|---|---|---|---|---|---|
| | Hydrocarbon A | Hydrocarbon B | | | Hydrocarbon C | | |
| Step | CPD | $C_2H_2$ | $pC_3H_4$ | VA | $aC_3H_4$ | $H_2O$ | [A]/[B] |
| Growth | 0.4923 | 0.8980 | 0.0042 | 0.0035 | 0.0013 | 0.0207 | 0.54 |

Besides the components shown in Table 18, trace amounts (no greater than 10 ppm) were detected of acetylene compounds in the form of 1-butyne, diacetylene, and phenylacetylene, a cyclopentadiene compound in the form of methylcyclopentadiene, and an allene compound in the form of 1,2-butadiene. Other detected components included hydrogen, methane, ethylene, propylene, 1,3-butadiene, acetone, cyclopentene, cyclopentane, benzene, toluene, indene, and naphthalene. In the present experimental example, a hydrocarbon A' and a hydrocarbon B' were both used as the feedstock gas and the total volume concentration [A] of a hydrocarbon A in the contacting gas was at least 0.06%; therefore, the present experimental example is referred to as "Example 6."

The properties of CNTs produced under the above-described conditions were evaluated. Table 19 shows the results.

TABLE 19

| | Yield [mg/cm$^2$] | Specific surface area [m$^2$/g] | G/D | Carbon conversion efficiency [%] |
|---|---|---|---|---|
| Example 6 | 5.3 | 975 | 4.3 | 40 |

It was demonstrated that the yield was increased by a factor of 2.7 and the carbon conversion efficiency was improved by a factor of approximately 27 compared to Comparative Example 1 while maintaining a specific surface area of at least 900 m$^2$/g.

Experimental Example 7

An aligned CNT aggregate was produced by carrying out a continuous process including a formation step and a growth step in a continuous growth furnace such as illustrated in FIG. 4. The above-described catalyst substrate (height 500 mm, width 500 mm) was placed on a mesh belt of the production apparatus and the aligned CNT aggregate was produced on the substrate while adjusting the conveyance speed of the mesh belt. Conditions in the various sections of the production apparatus were set as shown below (Table 20).

TABLE 20

| | Gas flow [sLm] Composition [vol %] | Internal furnace temperature [° C.] | Processing time [min] | Exhaust amount [sLm] |
|---|---|---|---|---|
| Inlet purge section 1 | 300 $N_2$: 100% | — | — | — |
| Gas mixing prevention means 11 | 100 $N_2$: 100% | — | — | 100 |
| Formation unit 2 | 140 $H_2$: 60% $N_2$: 40% | 760 | 28 | 140 |
| Gas mixing prevention means 12 | 125 $N_2$: 100% | — | — | 125 |
| Growth unit 3 | 150 CPE: 0.8% $C_2H_2$: 1.0% $H_2$: 1.2% $H_2O$: 0.0200% $N_2$: Remainder | 770 | 11 | 150 |
| Gas mixing prevention means 13 | 100 $N_2$: 100% | — | — | 100 |
| Cooling unit 4 | 50 $N_2$: 100% | 30 | 30 | — |
| Outlet purge section 5 | 250 $N_2$: 100% | — | — | — |

Amounts of gas sprayed by the reducing gas spraying section 2B and the feedstock gas spraying section 3B were set in proportion to furnace volume as appropriate amounts for aligned CNT aggregate production. In order to strongly prevent mixing of gases between the formation furnace 2A and the growth furnace 3A, the amount of sealing gas and the amount of exhaust gas of the gas mixing prevention means 12 were set highest among the three gas mixing prevention means 11, 12, and 13. A probe for gas sampling was installed in the growth unit 3 near a position by which the catalyst substrate passes. As a result of operating the apparatus in the same way as during aligned CNT aggregate production, but without a catalyst substrate passing through, heating the furnace while still empty, sampling gas through the probe, and analyzing the sampled gas, substantially the same results as in Example 6 were obtained for contacting gas composition.

Therefore, it was confirmed that through the above conditions, CNTs that are substantially the same as in Experimental Example 6 can be uniformly produced on a large, 500 mm×500 mm substrate (Example 7).

Experimental Example 8

CNTs were produced using the same production apparatus as in Experimental Example 1, but the composition of the feedstock gas in the growth step was changed as shown in Table 21. Conditions not shown in Table 21 were the same as in Experimental Example 1.

TABLE 21

| | Gas flow [sccm] | Feedstock gas composition [vol %] | | | | | [A']/[B'] | Carbon concentration [vol %] | Temperature [° C.] |
|---|---|---|---|---|---|---|---|---|---|
| | | Hydrocarbon A' CPE | Hydrocarbon B' $C_2H_2$ | $H_2$ | $H_2O$ | $N_2$ | | | |
| Comparative Example 8-1 | 5000 | 0 | 1.5 | 1 | 0.01 | Remainder | 0.00 | 3.0 | 760 |
| Example 8-1 | | 0.15 | 1.12 | 0.85 | | | 0.13 | | |

TABLE 21-continued

| | | Feedstock gas composition [vol %] | | | | | | | |
|---|---|---|---|---|---|---|---|---|---|
| | Gas flow [sccm] | Hydrocarbon A' CPE | Hydrocarbon B' $C_2H_2$ | $H_2$ | $H_2O$ | $N_2$ | [A']/[B'] | Carbon concentration [vol %] | Temperature [° C.] |
| Example 8-2 | | 0.36 | 0.6 | 0.64 | | | 0.60 | | |
| Example 8-3 | | 0.55 | 0.13 | 0.45 | | | 4.23 | | |
| Example 8-4 | | 0.6 | 0.01 | 0.4 | | | 60.00 | | |

CNTs were produced for each set of conditions by changing the ratio [A']/[B'] of the volume concentration [A'] of CPE and the volume concentration [B'] of $C_2H_2$ in the feedstock gas as shown in Table 21 while keeping the carbon concentration fixed (3.0%). Furthermore, in each set of conditions, the concentration of hydrogen, $H_2$, added to the feedstock gas was changed such that a total concentration including hydrogen produced by CPE thermal decomposition was 1% and the concentration of the catalyst activating material, $H_2O$, added to the feedstock gas was kept fixed at 0.0100%.

The heating time of the feedstock gas was adjusted by changing the installation position of the catalyst substrate. A growth step was initially carried out without installing a catalyst substrate and gas that was suction sampled at approximately 200 sccm near the substrate installation position was analyzed. Table 22 shows the analysis results.

TABLE 22

| | Contacting gas composition [vol %] | | | | | | |
|---|---|---|---|---|---|---|---|
| | Hydrocarbon A | Hydrocarbon B | | Hydrocarbon C | | | |
| | CPD | $C_2H_2$ | $pC_3H_4$ | VA | $aC_3H_4$ | $H_2O$ | [A]/[B] |
| Comparative Example 8-1 | 0.0006 | 1.4582 | 0.0015 | 0.0255 | 0.0002 | 0.0108 | 0.00 |
| Example 8-1 | 0.0672 | 1.1453 | 0.0008 | 0.0025 | 0.0002 | 0.0075 | 0.06 |
| Example 8-2 | 0.2294 | 0.6238 | 0.0005 | 0.0008 | 0.0004 | 0.0123 | 0.37 |
| Example 8-3 | 0.4788 | 0.1214 | 0.0003 | 0.0000 | 0.0007 | 0.0125 | 3.93 |
| Example 8-4 | 0.5637 | 0.0170 | 0.0004 | 0.0001 | 0.0011 | 0.0180 | 32.21 |

Besides the components shown in Table 22, trace amounts (no greater than several ppm) were detected of an acetylene compound in the form of phenylacetylene and a cyclopentadiene compound in the form of methylcyclopentadiene. Other detected components included hydrogen, ethylene, acetone, and cyclopentene.

It was clarified that, in the growth step, approximately 40% to 90% of cyclopentene introduced as the feedstock gas was converted to cyclopentadiene and at least 90% of acetylene introduced as the feedstock gas came into contact with the catalyst unconverted as acetylene.

The properties of CNTs produced under each set of conditions were evaluated. Table 23 shows the results.

TABLE 23

| | Yield [mg/cm$^2$] | Specific surface area [m$^2$/g] | G/D | Carbon conversion efficiency [%] |
|---|---|---|---|---|
| Comparative Example 8-1 | 2.0 | 1274 | 2.7 | 4.0 |
| Example 8-1 | 2.3 | 1142 | 3.8 | 4.6 |
| Example 8-2 | 3.8 | 1357 | 5.1 | 7.6 |
| Example 8-3 | 2.6 | 1209 | 5.7 | 5.7 |
| Example 8-4 | 2.9 | 929 | 5.1 | 5.8 |

In Examples 8-1 to 8-4 for which acetylene and CPE were both used as the feedstock gas, it was possible to increase the yield, while maintaining high specific surface area and G/D, compared to when ethylene was used as the feedstock gas (Comparative Example 1) and when only acetylene was used as the feedstock gas (Comparative Example 8-1). Furthermore, it was possible to improve carbon conversion efficiency by a factor of approximately 1.2 to 5.1 in the examples compared to Comparative Example 1. The improvement in carbon conversion efficiency makes a large contribution to reducing the production rate of exhaust tar by side reactions and reducing the carburization rate of furnace material.

Figure 2:
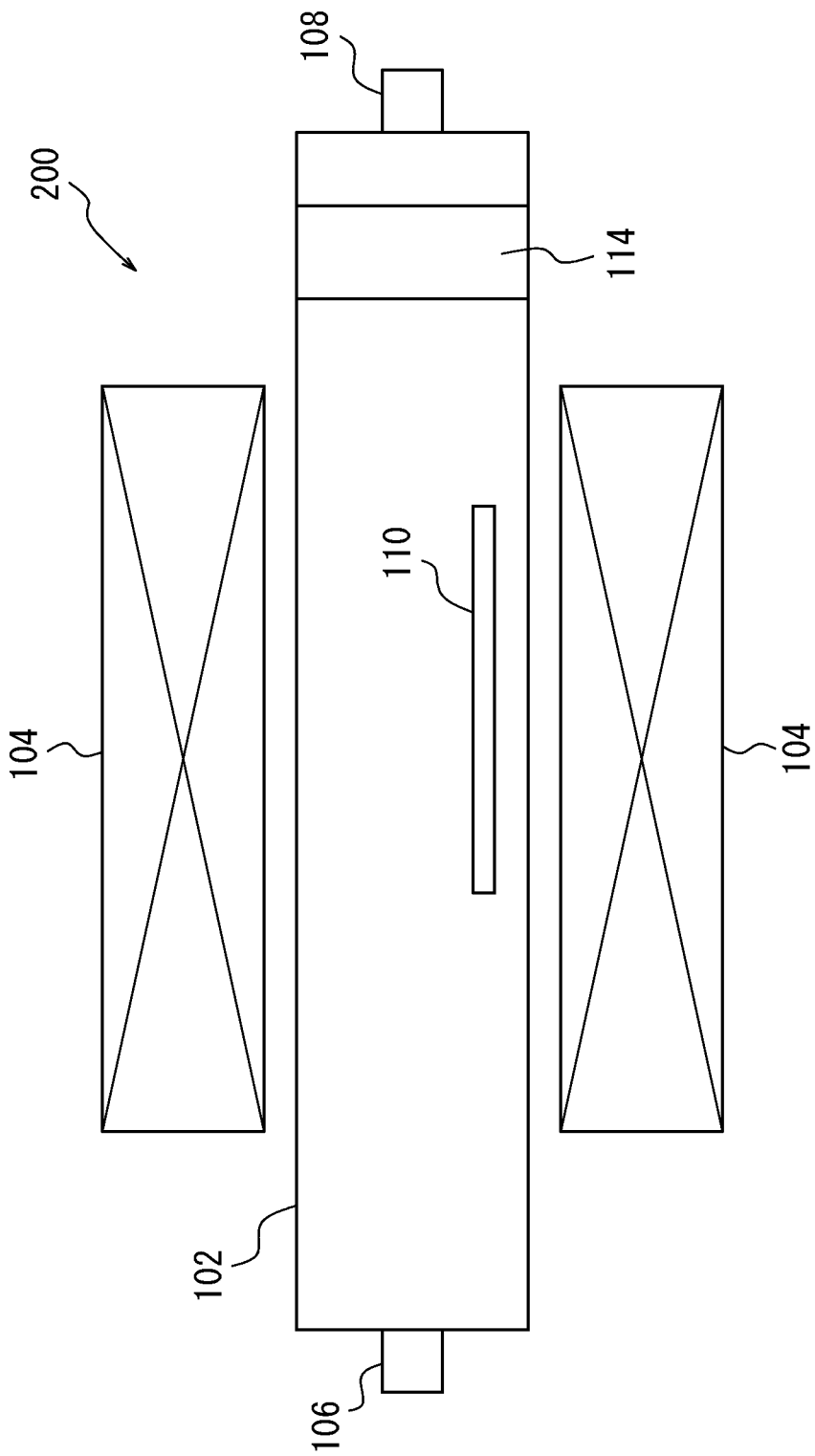
FIG. 2 is a schematic view illustrating an example of configuration of another CNT production apparatus that is applicable to the present disclosure.

Experimental Example 9: Comparison of Tar Production Rate and Furnace Material Carburization Rate A growth step was performed for a long period of time in a batch growth furnace such as illustrated in FIG. 2. The production rate of tar in exhaust and the carburization rate of furnace material were measured. The apparatus had the same configuration as the apparatus illustrated in FIG. 1 but with a tar collection cylinder 114 (made from SUS, Ø50 mm, length 33 mm) installed at an exhaust side of the furnace and a furnace material sample (SUS310S base material subjected to molten aluminum plating, height 44 mm, width 36 mm, thickness 0.25 mm) was installed at the installation position of the catalyst substrate. The growth step had the same conditions as in Experimental Examples 1 and 8 in all aspects other than that the gas flow was standardized as 2,000 sccm. Table 24 shows the tar production rate and the carburization rate of the furnace material sample under each set of conditions.

TABLE 24

|  | Tar production rate [mg/cm$^2$/min] | Carburization rate [mg/cm$^2$/min] |
| --- | --- | --- |
| Comparative Example 1 | 0.0013 | 0.00046 |
| Example 8-1 | 0.00055 | 0.00011 |
| Example 8-2 | 0.00068 | 0.00011 |
| Example 8-3 | 0.00055 | 0.00013 |
| Example 8-4 | 0.00055 | 0.00013 |

It was demonstrated that in Examples 8-1 to 8-4 for which acetylene and CPE were both used as the feedstock gas, the tar production rate could be reduced to approximately ½ and the carburization rate could be reduced to approximately ¼ of that when ethylene was used as the feedstock gas (Comparative Example 1).

Experimental Example 10

CNTs were produced by carrying out a formation step and a growth step in order in a batch growth furnace such as illustrated in FIG. 3. The CNTs were produced on a substrate surface by carrying out the formation step and the growth step in order using a catalyst substrate of 40 mm in height and 120 mm in width cut from the above-described catalyst substrate. Conditions in each of the steps were the same as in Example 8-2 in all aspects other than that the gas flow in the growth step was 2,000 sccm.

The properties of CNTs produced under the above-described conditions were evaluated. Table 25 shows the results.

TABLE 25

|  | Yield [mg/cm$^2$] | Specific surface area [m$^2$/g] | G/D | Carbon conversion efficiency [%] |
| --- | --- | --- | --- | --- |
| Example 9 | 3.0 | 1469 | 6.0 | 45 |

It was demonstrated that in Example 9, the carbon conversion efficiency could be improved by a factor of approximately 6 while maintaining substantially the same yield and specific surface area as in Example 8-2.

Experimental Example 11

An aligned CNT aggregate was produced by carrying out a continuous process including a formation step and a growth step in a continuous growth furnace such as illustrated in FIG. 4. The above-described catalyst substrate (height 500 mm, width 500 mm) was placed on a mesh belt of the production apparatus and the aligned CNT aggregate was produced on the substrate while adjusting the conveyance speed of the mesh belt. Conditions in the various sections of the production apparatus were set as shown below.

TABLE 26

|  | Gas flow [sLm] Composition [vol %] | Internal furnace temperature [° C.] | Processing time [min] | Exhaust amount [sLm] |
| --- | --- | --- | --- | --- |
| Inlet purge section 1 | 300 N$_2$: 100% | — | — | — |
| Gas mixing prevention means 11 | 100 N$_2$: 100% | — | — | 100 |
| Formation unit 2 | 140 H$_2$: 60% N$_2$: 40% | 760 | 28 | 140 |
| Gas mixing prevention means 12 | 125 N$_2$: 100% | — | — | 125 |
| Growth unit 3 | 150 CPE: 0.36% C$_2$H$_2$: 0.6% H$_2$: 0.64% H$_2$O: 0.0100% N$_2$: Remainder | 770 | 11 | 150 |
| Gas mixing prevention means 13 | 100 N$_2$: 100% | — | — | 100 |
| Cooling unit 4 | 50 N$_2$: 100% | 30 | 30 | — |
| Outlet purge section 5 | 250 N$_2$: 100% | — | — | — |

Amounts of gases sprayed by the reducing gas spraying section 2B and the feedstock gas spraying section 3B were set in proportion to furnace volume as appropriate amounts for aligned CNT aggregate production. In order to strongly prevent mixing of gases between the formation furnace 2A and the growth furnace 3A, the amount of sealing gas and the amount of exhaust gas of the gas mixing prevention means 12 were set highest among the three gas mixing prevention means 11, 12, and 13.

It was confirmed that through the above conditions, CNTs that are substantially the same as in Experimental Example 10 can be uniformly produced on a large, 500 mm×500 mm substrate. Furthermore, the frequency of maintenance that is required for continuous production over a long period of time was reduced to approximately ½ of that conventionally required (i.e., when ethylene is used as the feedstock gas).

The following explains Experimental Examples 12 and 13 which relate to production of CNTs having a high metallic CNT content.

Experimental Example 12

CNTs were produced using the same production apparatus as in Experimental Example 1, but the composition of the feedstock gas in the growth step was changed as shown in Table 27. Conditions not shown in Table 27 were the same as in Experimental Example 1.

TABLE 27

| | Gas flow [sccm] | Feedstock gas composition [vol %] | | | | | [A']/[B'] | Carbon concentration [vol %] | Temperature [° C.] |
|---|---|---|---|---|---|---|---|---|---|
| | | Hydrocarbon A' CPE | Hydrocarbon B' $C_2H_2$ | $H_2$ | $H_2O$ | $N_2$ | | | |
| Example 11-1 | 5000 | 0.31 | 0.73 | 0.69 | 0.010 | Remainder | 0.42 | 3.0 | 760 |
| Example 11-2 | | 0.40 | 0.50 | 0.60 | | | 0.80 | | |
| Example 11-3 | | 0.55 | 0.13 | 0.45 | | | 4.23 | | |
| Example 11-4 | | 0.60 | 0.00 | 0.40 | | | — | | |

CNTs were produced for each set of conditions by changing the concentration ratio ([A']/[B']) of CPE and $C_2H_2$ in the feedstock gas as shown in Table 27 while keeping the carbon concentration fixed (3.0%). Furthermore, in each set of conditions, the concentration of hydrogen, $H_2$, added to the feedstock gas was changed such that a total concentration including hydrogen produced by CPE thermal decomposition was 1% and the concentration of the catalyst activating material, $H_2O$, added to the feedstock gas was kept fixed at 0.010%.

The heating time of the feedstock gas was adjusted by changing the installation position of the catalyst substrate. A growth step was initially carried out without installing a catalyst substrate and gas that was suction sampled at approximately 200 sccm near the substrate installation position was analyzed. Table 28 shows the analysis results.

acetone, and cyclopentene. It was clarified that, in the growth step, approximately 40% to 90% of cyclopentene introduced as the feedstock gas was converted to cyclopentadiene and at least 90% of acetylene introduced as the feedstock gas came into contact with the catalyst unconverted as acetylene.

FIGS. 8 to 11 illustrate Raman spectra of CNTs produced under each set of conditions (A) and also illustrate the spectra after deconvolution analysis (B). Table 29 shows wavenumbers and intensities of peaks, specific surface area, purity according to X-ray fluorescence measurement, and central diameter size.

TABLE 28

| | Contacting gas composition [vol %] | | | | | | |
|---|---|---|---|---|---|---|---|
| | Hydrocarbon A | Hydrocarbon B | | | Hydrocarbon C | | |
| | CPD | $C_2H_2$ | $pC_3H_4$ | VA | $aC_3H_4$ | $H_2O$ | [A]/[B] |
| Example 11-1 | 0.2600 | 0.7424 | 0.0006 | 0.0011 | 0.0004 | 0.0077 | 0.35 |
| Example 11-2 | 0.3034 | 0.5224 | 0.0004 | 0.0005 | 0.0005 | 0.0123 | 0.58 |
| Example 11-3 | 0.4788 | 0.1214 | 0.0003 | 0.0000 | 0.0007 | 0.0125 | 3.94 |
| Example 11-4 | 0.5382 | 0.0035 | 0.0003 | 0.0000 | 0.0007 | 0.0142 | 153.77 |

Besides the components shown in Table 28, trace amounts (no greater than 10 ppm) were detected of an acetylene compound in the form of phenylacetylene and a cyclopentadiene compound in the form of methylcyclopentadiene. Other detected components included hydrogen, ethylene,

TABLE 29

| | | Raman Spectrum | | | | | Largest RBM peak | Specific surface area [m²/g] | Purity [%] | Central diameter size [nm] |
|---|---|---|---|---|---|---|---|---|---|---|
| | | G+ | Semiconducting | G- Metallic | | D | | | | |
| Example 11-1 | Wavenumber | 1595 | 1574 | 1551 | 1527 | 1331 | 228 | 1368 | 99 | 1.5 |
| | Intensity | 1 | 0.58 | 0.49 | 0.43 | 0.2 | 0.46 | | | 3.5 |
| Example 11-2 | Wavenumber | 1595 | 1572 | 1549 | 1524 | 1333 | 228 | 1371 | 99 | 1.5 |
| | Intensity | 1 | 0.59 | 0.47 | 0.43 | 0.19 | 0.49 | | | 3.5 |
| Example 11-3 | Wavenumber | 1596 | 1576 | 1550 | 1525 | 1327 | 229 | 1209 | 99 | 1.5 |
| | Intensity | 1 | 0.57 | 0.49 | 0.45 | 0.17 | 0.6 | | | 3.5 |
| Example 11-4 | Wavenumber | 1594 | 1572 | 1543 | 1523 | 1329 | 227 | 1158 | 99 | 1.5 |
| | Intensity | 1 | 0.56 | 0.49 | 0.45 | 0.16 | 0.61 | | | 3.5 |

Two G− band peaks (near 1520 cm$^{-1}$ and near 1550 cm$^{-1}$) caused by metallic CNTs were detected in each of the experimental examples and the total intensity of the G− band peaks caused by metallic CNTs was confirmed to be at least 0.6 in each example for which 0.3≤[A]/[B]≤1,000 was satisfied. Furthermore, a largest RMB peak was confirmed to be near 230 cm$^{-1}$, within the range from 200 cm$^{-1}$ to 270 cm$^{-1}$.

FIG. 12 is a histogram of a diameter distribution of CNTs produced in Example 11-4. The CNTs had a double peak distribution with peaks near a diameter of 1 nm and near a diameter of 4 nm, and had an average diameter of 3.2 nm. Central diameter sizes were 1.5 nm and 3.5 nm. The same was observed in Examples 11-1, 11-2, and 11-3.

The CNTs of the examples were demonstrated without discrepancy to include a large number of metallic CNTs having a diameter of approximately 1 nm by the CNT diameter distribution having a peak near a diameter of 1 nm and by the Raman spectrum having the following two features: (1) a plurality of intense G− band peaks caused by metallic CNTs; and (2) a RBM peak near 230 cm$^{-1}$ caused by metallic CNTs having a diameter of approximately 1 nm. It is also thought that CNT bundling can be prevented and high specific surface area can be maintained due to the CNTs in the examples including a large number of CNTs having diameters from 3 nm to 5 nm.

Experimental Example 13

FIGS. 13 and 14 illustrate Raman spectra of CNTs produced under the conditions of the above-described Examples 2-2 and 2-3 (A), and also illustrate the spectra after deconvolution analysis (B). Table 30 shows wavenumbers and intensities of peaks, specific surface area, purity according to X-ray fluorescence measurement, and central diameter size.

TABLE 30

|  |  |  | Raman spectrum |  |  |  |  | Specific surface area [m²/g] | Purity [%] | Central diameter size [nm] |
|---|---|---|---|---|---|---|---|---|---|---|
|  |  | G+ | G− Semiconducting | G− Metallic |  | D | Largest RBM peak |  |  |  |
| Example 2-2 | Wavenumber | 1597 | 1578 | 1549 | 1527 | 1332 | 231 | 1096 | 99 | 1.5 |
|  | Intensity | 1 | 0.56 | 0.46 | 0.42 | 0.18 | 0.49 |  |  | 3.5 |
| Example 2-3 | Wavenumber | 1592 | 1571 | 1549 | 1522 | 1331 | 226 | 833 | 99 | 1.5 |
|  | Intensity | 1 | 0.58 | 0.48 | 0.43 | 0.24 | 0.43 |  |  | 3.5 |

It was confirmed that even when the carbon concentration was increased to 6% or 9% with [A]/[B] being approximately 0.6, two G− band peaks (near 1520 cm$^{-1}$ and near 1550 cm$^{-1}$) caused by metallic CNTs were detected and the peaks had a total intensity of at least 0.6. Furthermore, a largest RMB peak was confirmed to be at approximately 230 cm$^{-1}$, within the range from 200 cm$^{-1}$ to 270 cm$^{-1}$.

INDUSTRIAL APPLICABILITY

The presently disclosed carbon nanostructure production method enables highly efficient production of a high-quality carbon nanostructure.

REFERENCE SIGNS LIST 100, 200, 300 CNT production apparatus
102 reaction furnace
104 heater
106 gas supply inlet
108 exhaust vent
110 holder
112 shower head
114 tar collection cylinder
400 CNT production apparatus
1 inlet purge section
2 formation unit
3 growth unit
4 cooling unit
5 outlet purge section
6 conveyance unit
7, 8, 9 connecting section
10 catalyst substrate
11, 12, 13 gas mixing prevention means

The invention claimed is:

1. Carbon nanotubes having a specific surface area of from 600 m²/g to 2,500 m²/g and having a purity of at least 98% according to X-ray fluorescence measurement, wherein in a Raman spectrum measured by resonance Raman scattering at an excitement wavelength of 532 nm,

[Math 1]

$$0.6 \leq \left( \sum_{k=1}^{n} I_{BFW}^{k} \right) / I_{G+}$$ [Math 1]

where $I_{G+}$ represents intensity of a G+ band peak appearing near 1590 cm$^{-1}$, $I^{k}_{BWF}$ represents intensity of a $k^{th}$ G− band peak among n G− band peaks appearing in a range from 1500 cm$^{-1}$ to 1560 cm$^{-1}$, and n represents an integer of at least 1.

2. The carbon nanotubes of claim 1, wherein a largest peak among RBM peaks appearing in a range from 100 cm$^{-1}$ to 350 cm$^{-1}$ in the Raman spectrum is in a range from 200 cm$^{-1}$ to 270 cm$^{-1}$.

3. The carbon nanotubes of claim 1, wherein a central diameter size is from 1 nm to 5 nm.

4. The carbon nanotubes of claim 2, wherein a central diameter size is from 1 nm to 5 nm.

* * * * *